US012776627B2

(12) United States Patent
Ledentsov et al.

(10) Patent No.: US 12,776,627 B2
(45) Date of Patent: Oct. 27, 2026

(54) HIGH SPEED NARROW SPECTRUM MINIARRAY OF VCSELs AND DATA TRANSMISSION DEVICE BASED THEREUPON

(71) Applicants: Nikolay Ledentsov, Berlin (DE); Vitaly Shchukin, Berlin (DE)

(72) Inventors: Nikolay Ledentsov, Berlin (DE); Vitaly Shchukin, Berlin (DE)

(73) Assignee: VI Systems GmbH, Berlin (DE)

( * ) Notice: Subject to any disclaimer, the term of this patent is extended or adjusted under 35 U.S.C. 154(b) by 1050 days.

(21) Appl. No.: 17/724,041

(22) Filed: Apr. 19, 2022

(65) Prior Publication Data

US 2022/0368113 A1 Nov. 17, 2022

Related U.S. Application Data

(60) Provisional application No. 63/310,196, filed on Feb. 15, 2022, provisional application No. 63/230,700, (Continued)

(51) Int. Cl.
*H01S 5/42* (2006.01)
*H01S 5/028* (2006.01)
(Continued)

(52) U.S. Cl.
CPC ............ *H01S 5/423* (2013.01); *H01S 5/0286* (2013.01); *H01S 5/1021* (2013.01); *H01S 5/18* (2013.01);
(Continued)

(58) Field of Classification Search
CPC ......... H01S 5/0042; H01S 5/028–0287; H01S 5/42–423; H01S 5/1021;
(Continued)

(56) References Cited

U.S. PATENT DOCUMENTS 6,507,595 B1 * 1/2003 Kapon .................... H01S 5/423 372/45.01
2005/0100070 A1 * 5/2005 Nakayama .............. H01S 5/423 372/50.1
(Continued)

OTHER PUBLICATIONS

Martino D'Alessandro et al. "Transverse Coupled Cavity VCSELs: Bridging Ultrabroadband Dynamics to Optical Supermodes"; IEEE Photonics Journal, vol. 16; No. 2; Apr. 2024; 0600807; 7 pages.

*Primary Examiner* — Sean P Hagan
(74) *Attorney, Agent, or Firm* — Howard N. Shipley; Gordon Rees Scully & Mansukhani, LLP

(57) ABSTRACT

An on-chip miniarray of optically coupled oxide-confined apertures of vertical cavity surface emitting lasers (VCSELs) is realized by the oxidation through openings formed by etching from the top surface crossing at least one aperture layer subject to oxidation. Oxidation of the aperture layer results in aperture regions suitable for current injection. The lateral distance and shape of the apertures are chosen to result in effective coupling of optical modes and formation of lateral optical supermodes. An antireflective coating deposited over at least one aperture enables an operation regime where at least one supermode lases and at least one supermode does not lase. The photon-photon interaction between the lasing and the non-lasing mode results in a broad modulation frequency response. Such broadening allows an increase in (−3 dB) modulation bandwidth of the VCSEL miniarray up to at least 70 GHz.

18 Claims, 25 Drawing Sheets

Related U.S. Application Data filed on Aug. 7, 2021, provisional application No. 63/188,397, filed on May 13, 2021.

(51) Int. Cl.

| | |
|---|---|
| ***H01S 5/10*** | (2021.01) |
| ***H01S 5/18*** | (2021.01) |
| ***H01S 5/183*** | (2006.01) |

(52) U.S. Cl.

CPC ...... *H01S 5/18311* (2013.01); *H01S 5/18377* (2013.01); *H01S 5/18338* (2013.01); *H01S 5/18355* (2013.01); *H01S 2301/16* (2013.01)

(58) Field of Classification Search

CPC ..... H01S 5/183–18397; H01S 5/18358; H01S 5/18361; H01S 5/18377; H01S 5/18383; H01S 5/3086–309

See application file for complete search history.

(56) References Cited

U.S. PATENT DOCUMENTS

| | | | | |
|---|---|---|---|---|
| 2005/0226294 | A1* | 10/2005 | Ledentsov | B82Y 20/00 372/50.1 |
| 2009/0268764 | A1* | 10/2009 | Reithmaier | H01S 5/06256 372/29.016 |
| 2012/0105932 | A1* | 5/2012 | Ledentsov | H01S 5/12 977/932 |
| 2019/0237940 | A1* | 8/2019 | Wong | H01S 5/0421 |
| 2020/0169065 | A1* | 5/2020 | Carson | H01S 5/423 |

* cited by examiner

Ledentsov. "HIGH SPEED NARROW SPECTRUM MINIARRAY OF VCSELS ..."

HIGH SPEED NARROW SPECTRUM MINIARRAY OF VCSELs AND DATA TRANSMISSION DEVICE BASED THEREUPON

REFERENCE TO RELATED APPLICATIONS

This application claims an invention which was disclosed in Provisional Application No. 63/188,397, filed May 13, 2021, entitled "DATA TRANSMISSION DEVICE AND METHOD OF MAKING SAME", in Provisional Application No. 63/230,700, filed Aug. 7, 2021, entitled "DATA TRANSMISSION DEVICE BASED ON A MICROARRAY OF VCSELS AND METHOD OF MAKING SAME", and in Provisional Application No. 63/310,196, filed Feb. 15, 2022, entitled "MINIARRAY OF VCSELS AND DATA TRANSMISSION DEVICE BASED THEREUPON". The benefit under 35 USC § 119(e) of the United States provisional applications is hereby claimed, and the aforementioned applications are hereby incorporated herein by reference.

BACKGROUND OF THE INVENTION

Field of the Invention

The invention pertains to the field of optoelectronic devices. More particularly, the invention pertains to light-emitting devices.

Description of Related Art

Vertical Cavity Surface Emitting Lasers (VCSELs) have a broad area of applications covering data transmission, sensing, gesture recognition, illumination and display applications. VCSELs are key components for optical interconnects and are widely applied in high performance computers and data centers. The development of short reach high-speed data transmission systems according to the Roadmap of the Institute of Electrical and Electronics Engineers (IEEE) is accompanied by the doubling of the bit rate via core networking approximately every 18 months. Data transmission at a rate 160 Gb/s per channel was reported in 2020, which can be found in the publication "Optical Interconnects using Single-Mode and Multi-Mode VCSEL and Multi-Mode Fiber", by Ledentsov, et al., published in 2020 Optical Fiber Communications Conference and Exhibition (OFC), 2020, pp. 1-3, whereas this publication is hereby incorporated herein in its entirety by reference. There is a continuous demand to further increase the modulation bandwidth of the devices.

A typical industrial VCSEL is processed from an epitaxially grown semiconductor wafer. FIG. 1 represents a schematic vertical cross-section of a typical prior art device (100). The epitaxial structure grown on a substrate (101) contains an optical cavity (103), further containing a p-n junction (104), where the active medium (105) is placed. Thus, the cavity is sandwiched between a bottom distributed Bragg reflector, DBR, (102) and a top DBR (106), each DBR being composed of alternating layers having a high and a low refractive index. The bottom DBR is preferably n-doped, and the top DBR is preferably p-doped.

In order to define the path for the electric current, oxide-confined aperture is employed. Since the oxidation rate of the alloy material Ga(1−x)Al(x)As depends drastically on the gallium content, reaching the maximum value for the pure binary AlAs and decreasing rapidly upon adding gallium, the selective oxidation is possible, where one or several layers of AlAs or Ga(1−x)Al(x)As with a high Al content (preferably above 95%) is oxidized forming amorphous dielectric material AlO(y) or Ga(1−x)Al(x)O(y) (120), whereas the rest of the layers remain hardly affected by the oxidation. The oxide-confined aperture (125) defines the path of the electric current controlling the generation of light in the active medium (105) just beneath the aperture. The part (150) of the top surface not containing the contact (112) is broader that the aperture (125). This helps preventing generation of light beneath the contact pads (115) and metal contacts (112) and thus prevents the absorption of light in the contacts. FIG. 1 shows schematically a bottom contact (111) mounted on the back side of the substrate (101) and a top contact (112) mounted on the top surface (190) of the top DBR (106).

The device (100) contains a mesa (160) made such that the selective oxidation can be performed. The oxidation begins at the side surface of the mesa (160) and depending on the particular conditions of the oxidation processes results in the foundation of an oxide layer (120) having a certain depth. As a result, the aperture (125) confined by the oxide (120) is formed.

Once a forward bias is applied to the active region (105) via the top contact (112) and the bottom contact (111), the current passing the active region (105) beneath the aperture (125) results in generation of light which comes out (185) of the device (100) through the part (150) of the top surface (190).

To meet with the requirements of the IEEE Roadmap on data transmission, the device needs to provide error-free transmission at a high transmission rate. Error-free transmission requires, on the one hand, keeping the relaxation oscillation frequency in the active medium higher than the data transmission rate, which implies a need in a high output power. The latter, in turn, requires having a sufficiently large aperture diameter. On the other hand, the chromatic dispersion in the multimode fiber requires a significantly narrow spectrum of the emitted light. The two requirements, one for a large aperture, and one for a narrow spectrum are contradicting and thus creating a challenge for designing a device meeting both these tough requirements together. One of the possible approaches includes using an array of VCSELs, each of which has an essentially small aperture and emitting light with a narrow spectrum, e. g., a single lateral mode laser light (or, what is the same, a single transverse mode laser light). However, using array of VCSELs of FIG. 1 implies too large lateral size of an array. The mesa (160) requires having a sufficient space for the top contact pad (115). This implies a minimum lateral size of the mesa (160). A skilled in the art will appreciate that the mesa diameter should exceed 18 μm. An array of several VCSELs, similar to that shown in FIG. 1, would have a significant lateral size. On the other hand, the source of the light should be rather compact to ensure an efficient coupling to a multimode fiber having a typical diameter of 50 μm.

Thus, there is a need in the art for a miniarray of VCSELs capable for an efficient coupling of the emitted laser light to a multimode fiber.

SUMMARY OF THE INVENTION

An on-chip mini-array of optically-coupled oxide-confined apertures of vertical cavity surface emitting lasers is realized by etching holes from the chip surface down to at least one aperture layer. Oxidation of the aperture layer results in electrically isolated apertures suitable for current injection. The lateral distance between the aperture centers and the shape of the aperture is chosen to result in effective interaction of the neighboring optical modes in the related aperture regions through optical field coupling effect causing the interaction-induced splitting of the wavelengths of the optical modes confined by different neighboring apertures. At least one aperture has a different surface area due to different spacing of the etched holes. Different aperture sizes result in different wavelengths of the coupled modes. Splitting of the cavity modes in a frequency domain 3-100 GHz extends the modulation bandwidth of the device due to photon-photon interaction effects.

Selective deposition of highly reflecting coating and/or anti-reflective coating over apertures of different VCSELs forming a miniarray allows stabilizing lasing in a single coherent mode of the array. Most preferably, highly reflecting coating covers the largest aperture and stabilizes the fundamental mode of the coherent array. Anti-reflective coatings can be deposited on at least one other aperture to reduce the photon lifetime and increase the homogeneous broadening of the related resonant wavelength. Consequently, broadening of the photon-photon interaction resonances between the cavity modes can be controlled. Such resonance broadening allows control over the shape of the current modulation curve of the miniarray of VCSELs with the frequency maximum defined by the splitting of the cavity modes and the broadening defined by the broadening of the photon resonances. An increase in −3 dB modulation bandwidth of the VCSEL miniarray up to at least 70 GHz is possible.

Such miniarray of VCSELs enables efficient coupling of the emitted light to a multimode optical fiber with the efficiency of at least 70%.

17A illustrates a refractive index profile as well as the profiles of the vertical optical mode and a waveguided mode for a waveguiding VCSEL having 1λ-cavity. The profiles are shown for the central part of the structure.

Figure 17A:
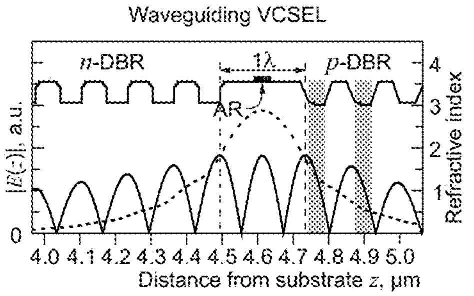
FIGS. 17A through 17J illustrate a difference between a waveguiding VCSEL and an antiwaveguiding VCSEL. FIG.
Figure 17B:
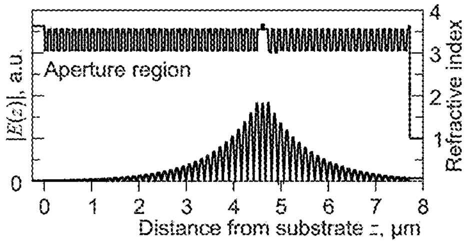

FIG. 17B illustrates a refractive index profile as well as the profiles of the vertical optical mode for a waveguiding VCSEL having 1λ-cavity. The profiles are shown for the non-oxidized area (for the aperture area).

Figure 17C:
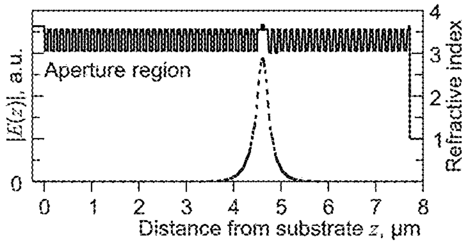

FIG. 17C illustrates a refractive index profile as well as the profiles of the waveguided optical mode for a waveguiding VCSEL having 1λ-cavity. The profiles are shown for the non-oxidized area (for the aperture area).

Figure 17D:
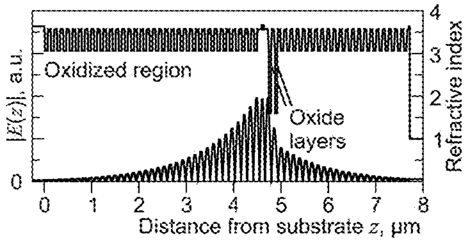

FIG. 17D illustrates a refractive index profile as well as the profiles of the vertical optical mode for a waveguiding VCSEL having 1λ-cavity. The profiles are shown for the oxidized area.

Figure 17E:
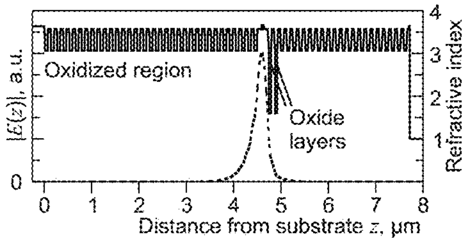

FIG. 17E illustrates a refractive index profile as well as the profiles of the waveguided optical mode for a waveguiding VCSEL having 1λ-cavity. The profiles are shown for the oxidized area. Only a slight difference from the mode profile of FIG. 17C is encountered.

Figure 17F:
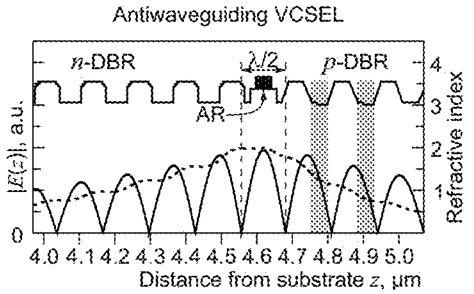

FIG. 17F illustrates a refractive index profile as well as the profiles of the vertical optical mode and a waveguided mode for an antiwaveguiding VCSEL having λ/2-cavity. The profiles are shown for the central part of the structure.

Figure 17G:
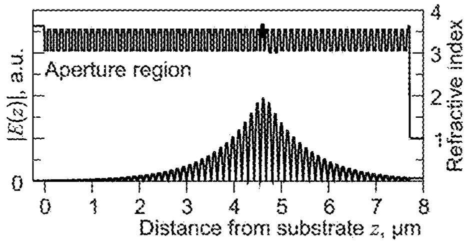

FIG. 17G illustrates a refractive index profile as well as the profiles of the vertical optical mode for an antiwaveguiding VCSEL having λ/2-cavity. The profiles are shown for the non-oxidized area (for the aperture area).

Figure 17H:
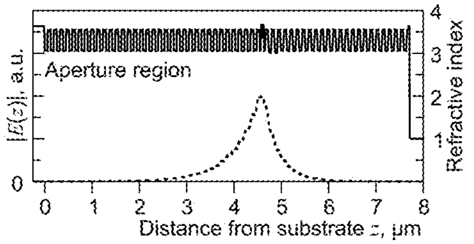

FIG. 17H illustrates a refractive index profile as well as the profiles of the waveguided optical mode for an antiwaveguiding VCSEL having λ/2-cavity. The profiles are shown for the non-oxidized area (for the aperture area).

Figure 17I:
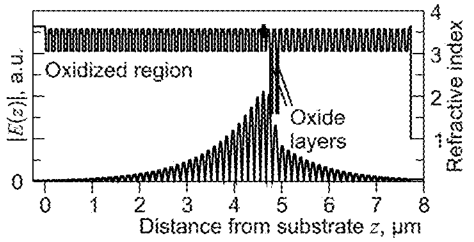

FIG. 17I illustrates a refractive index profile as well as the profiles of the vertical optical mode for an antiwaveguiding VCSEL having λ/2-cavity. The profiles are shown for the oxidized area.

Figure 17J:
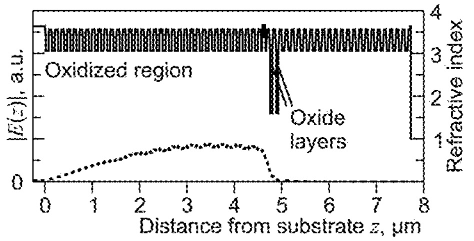

FIG. 17J illustrates a refractive index profile as well as the profiles of the waveguided optical mode for an antiwaveguiding VCSEL having λ/2-cavity. The profiles are shown for the oxidized area. A drastic suppression of the mode in the active region versus the profile of FIG. 17H is encountered.

Figure 18:
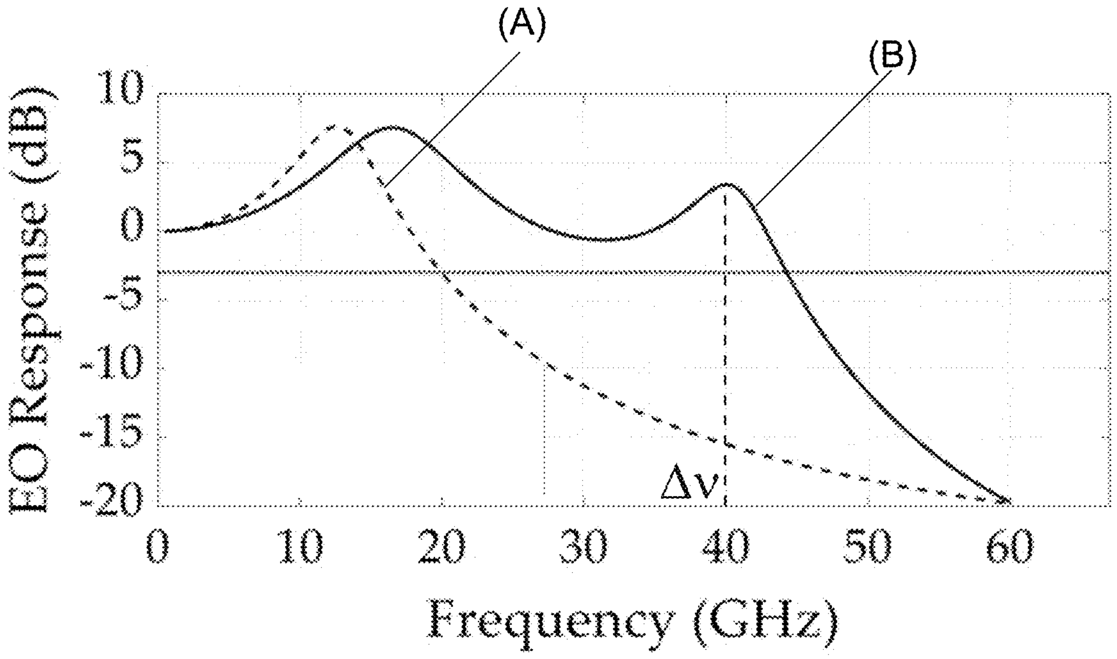

FIG. 18 illustrates schematically a substantial increase of a −3 dB cutoff frequency (modulation bandwidth) of an electrooptical device having two coupled cavities and operating via a coupled optical mode.

Figure 19:
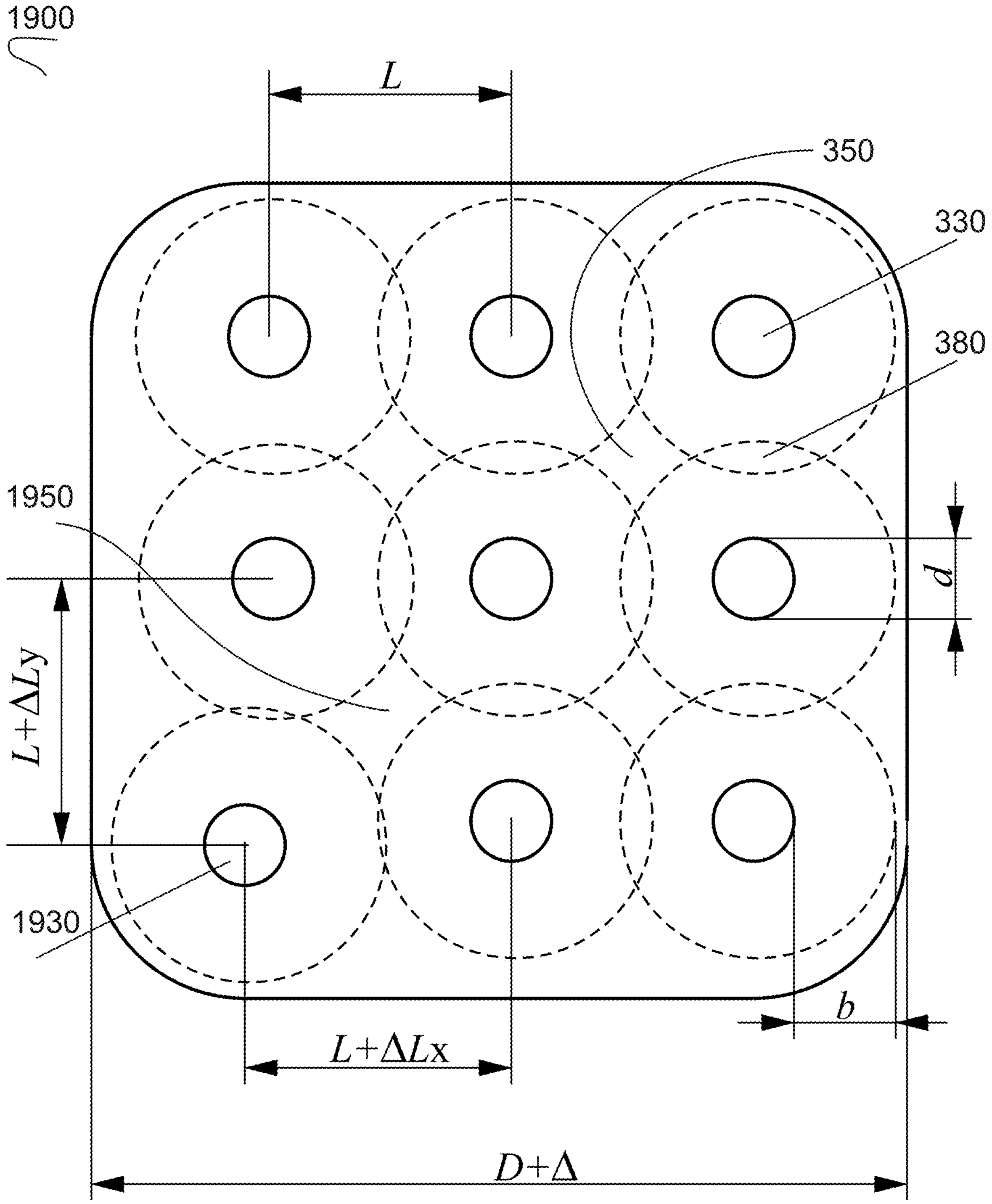

FIG. 19. Schematic cross-section in the lateral plane of a miniarray of VCSELs, according to an embodiment of the present invention, whereas one of the holes is shifted such that one aperture formed by a non-oxidized area is larger than the other apertures.

Figure 20:
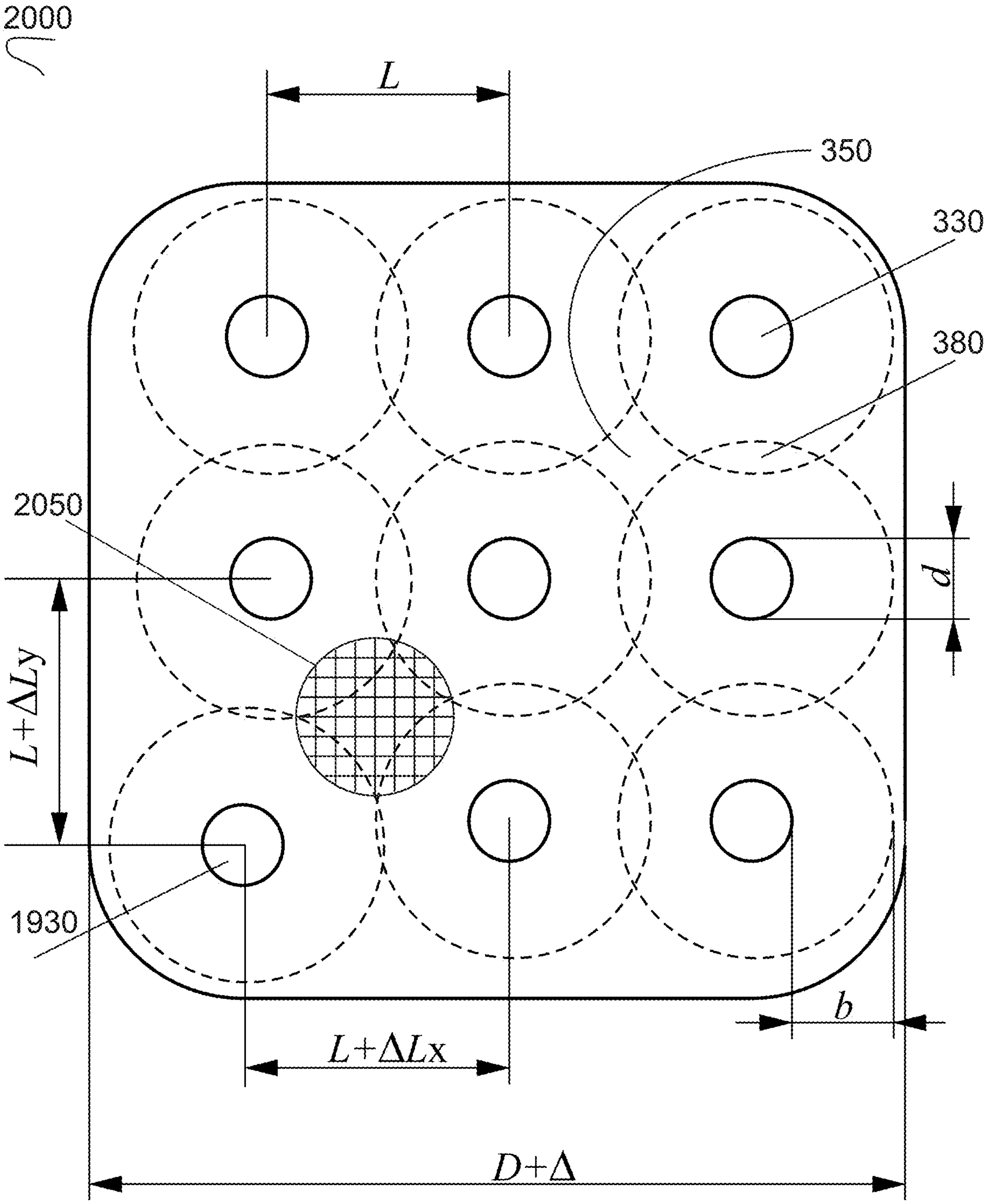

FIG. 20. Schematic cross-section in the lateral plane of a miniarray of VCSELs, according to another embodiment of the present invention, whereas a larger aperture is capped by a highly reflecting coating.

Figure 21:
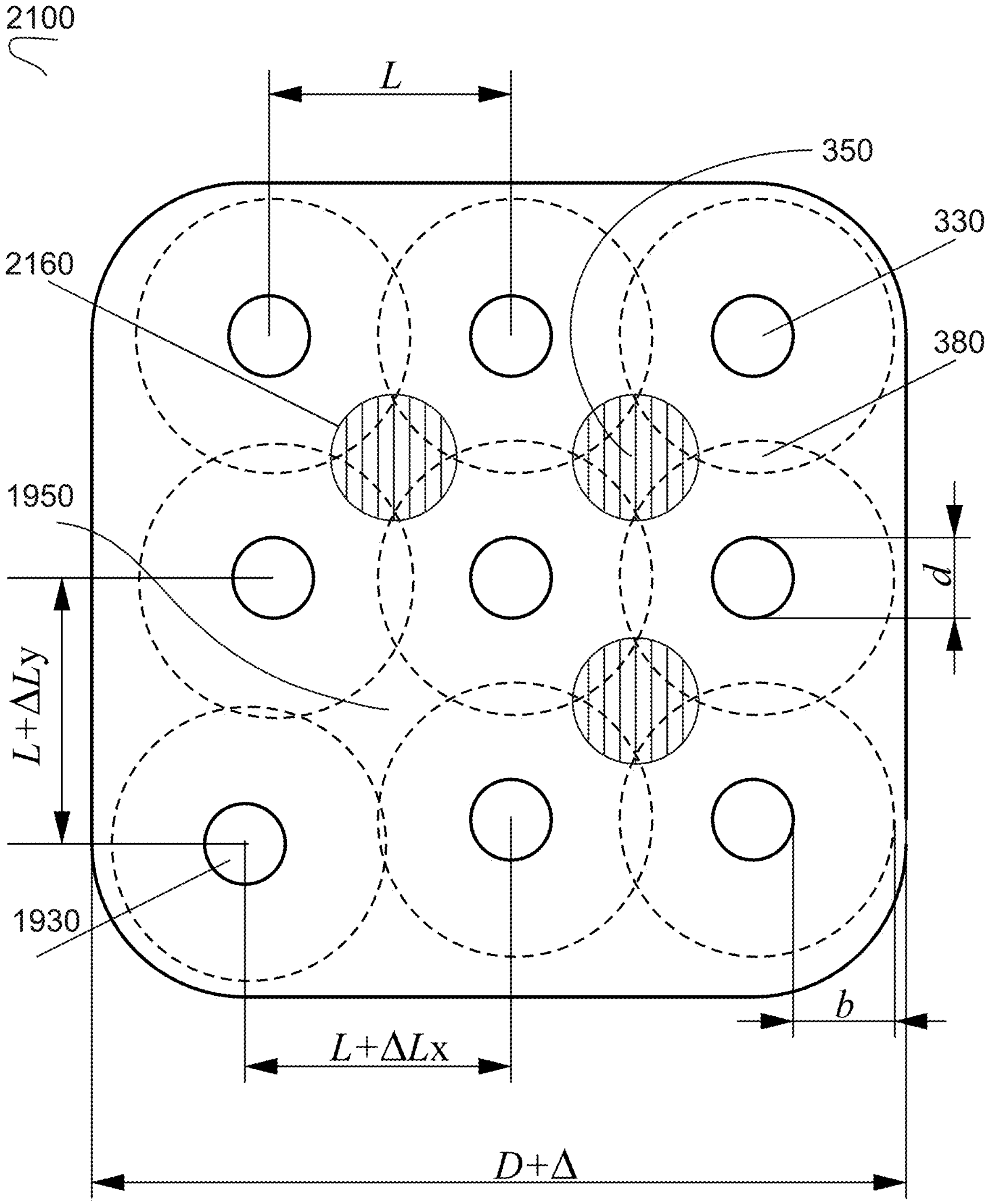

FIG. 21. Schematic cross-section in the lateral plane of a miniarray of VCSELs, according to yet another embodiment of the present invention, whereas all apertures but the larger one are capped by anti-reflective coatings.

Figure 22:
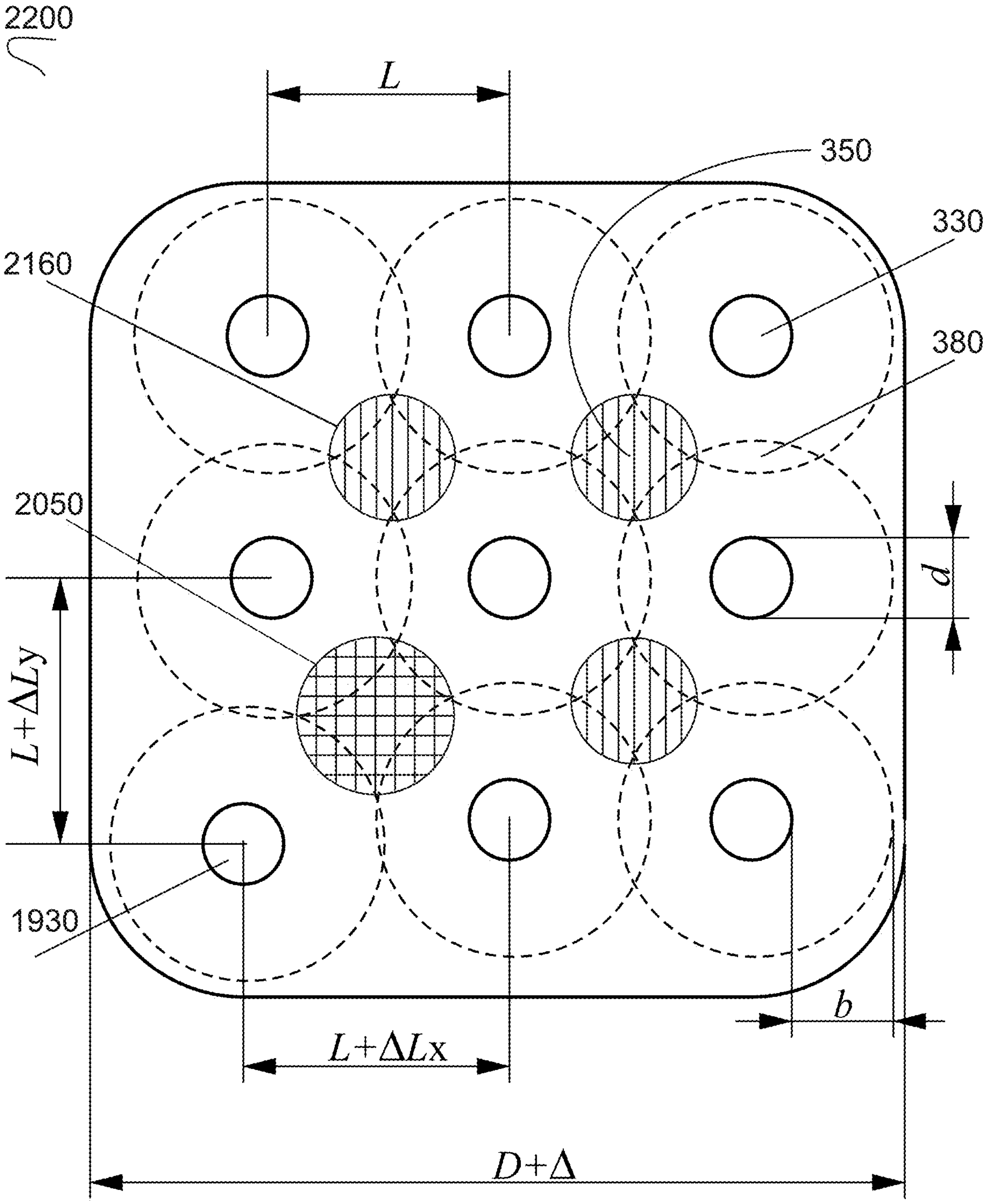

FIG. 22. Schematic cross-section in the lateral plane of a miniarray of VCSELs, according to a further embodiment of the present invention, whereas the larger aperture is capped by a highly reflecting coating, and all the other apertures are capped by anti-reflective coatings.

Figure 23:
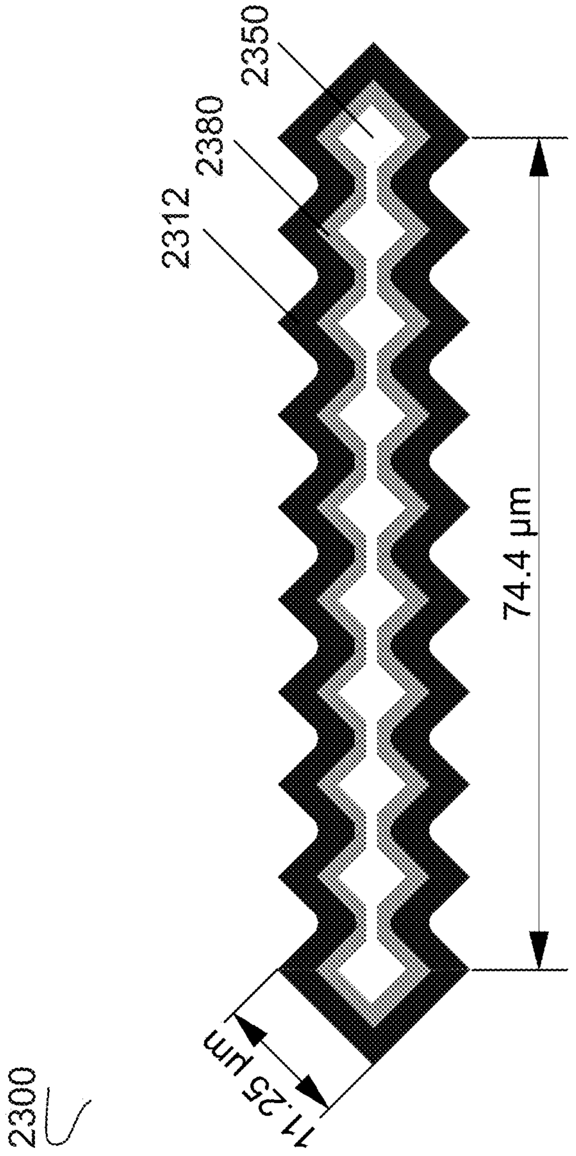

FIG. 23. Schematic cross-section in the lateral plane of a miniarray of VCSELs, whereas different VCSELs are electrically addressed independently.

Figure 24A:
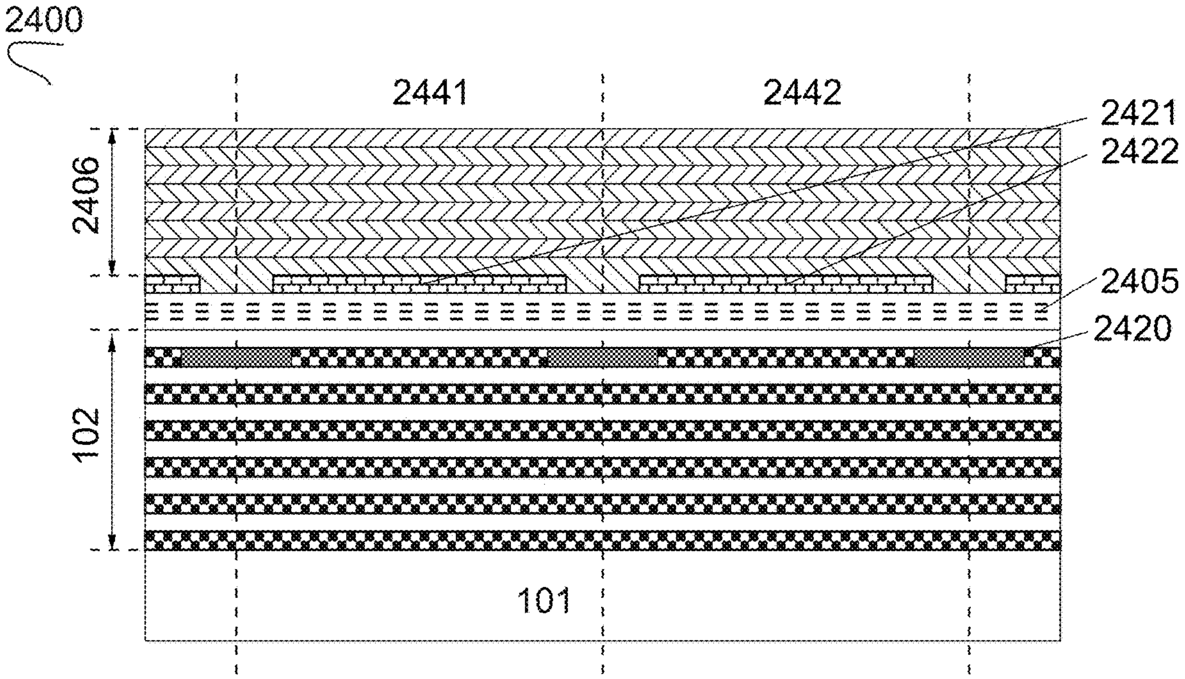

FIG. 24A. Schematic cross-section in the vertical plane of a miniarray of VCSELs, illustrating a possibility to electrically address different VCSELs independently.

Figure 24B:
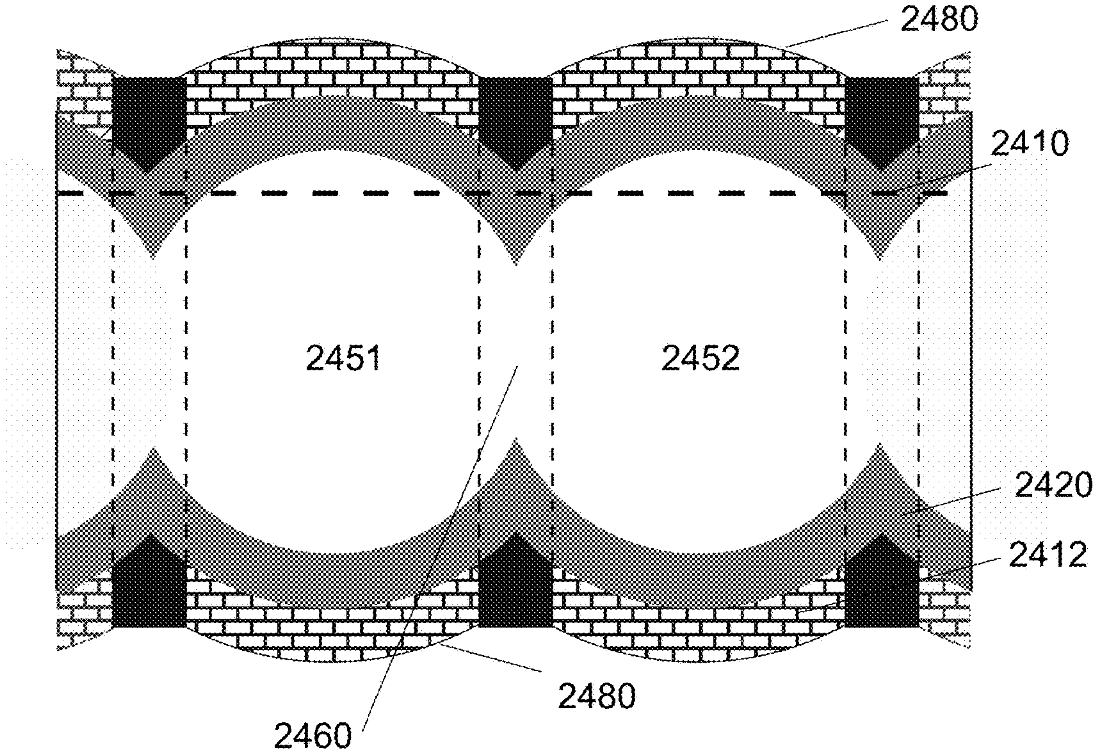

FIG. 24B. Schematic cross-section in the lateral plane of a miniarray of VCSELs of FIG. 24A, illustrating a possibility to electrically address different VCSELs independently.

Figure 25:
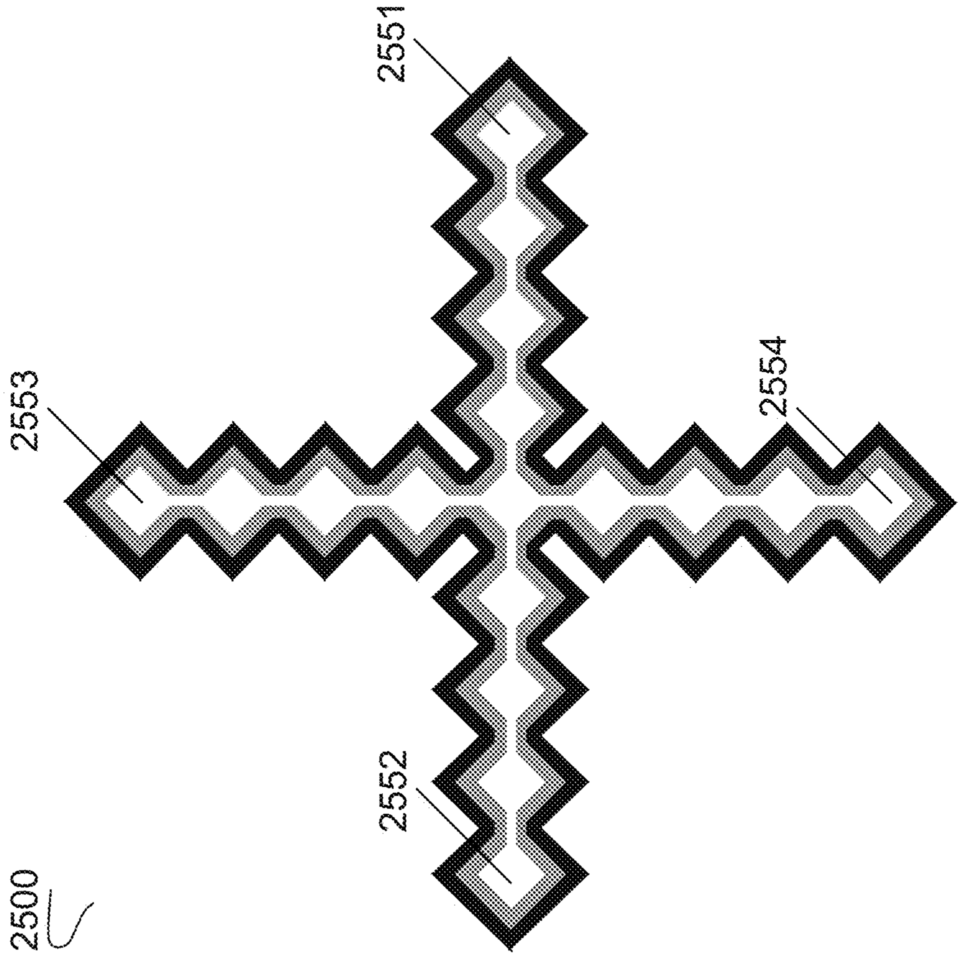

FIG. 25. Schematic cross-section in the lateral plane of a two-dimensional miniarray of VCSELs, whereas different VCSELs are electrically addressed independently.

DETAILED DESCRIPTION OF THE INVENTION

Figure 1:
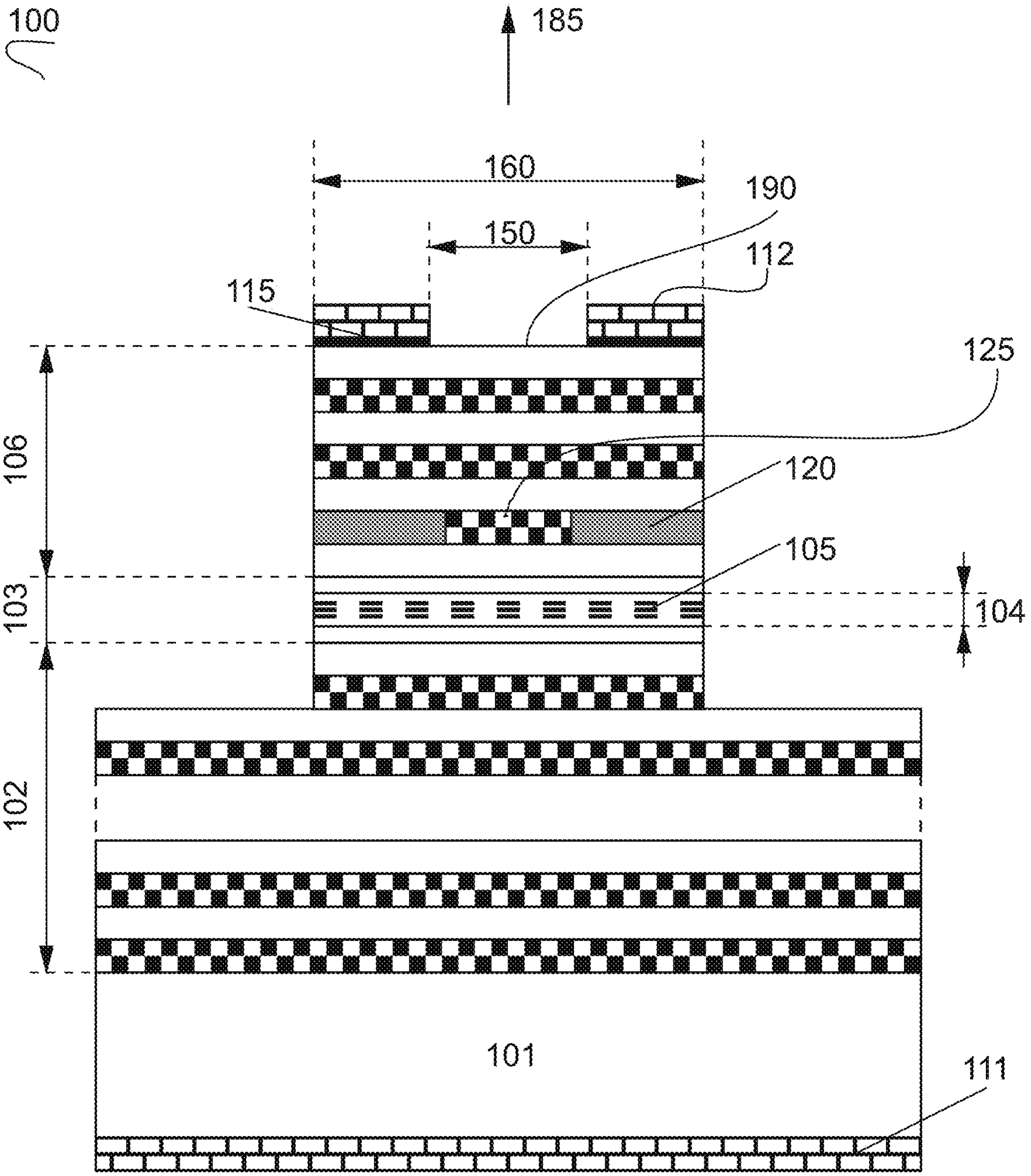
FIG. 1. Prior Art
FIG. 1. Schematic cross-section in the vertical plane of a prior art vertical-cavity surface-emitting laser (VCSEL).
Figure 2:
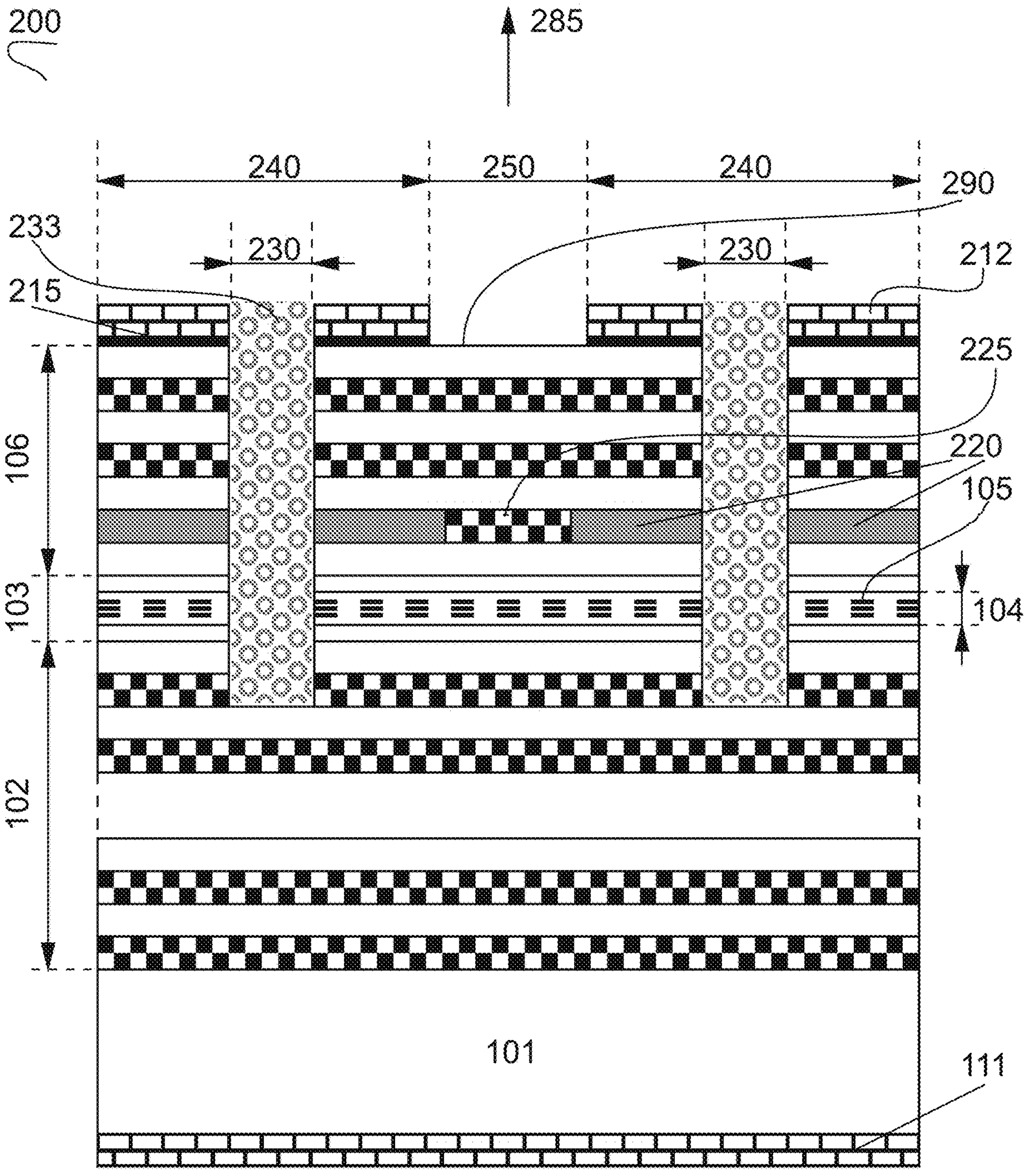
FIG. 2. Schematic cross-section in the vertical plane of a miniarray of VCSELs, in which the selective oxidation starts from the openings in the structure and results in the formation of oxide-confined apertures.

FIG. 2 shows schematically a cross-section in the vertical plane of a miniarray (200) of VCSELs. Openings (230) are formed in the VCSEL-type epitaxial wafer. The openings are etched from the top surface (290) through the layer subject to oxidation. The selective oxidation is performed, and oxidized areas (220) are formed around the openings (230). Some areas in the layer subject to oxidation remain non oxidized (225). The openings (230) are filled with a dielectric (233). The non-oxidized areas in the layer subject to selective oxidation form the apertures (225). The miniarray (200) contains individual VCSELs (250) separated by the areas (240). The contact pads (215) and the top contact (212) are deposited on the parts of the top surface (290), those parts are distinct from the areas above the apertures (225) as well as they are distinct from the openings (230). The emitted laser light comes out (285) from each of the VCSELs (250) of the miniarray (200).

Figure 3:
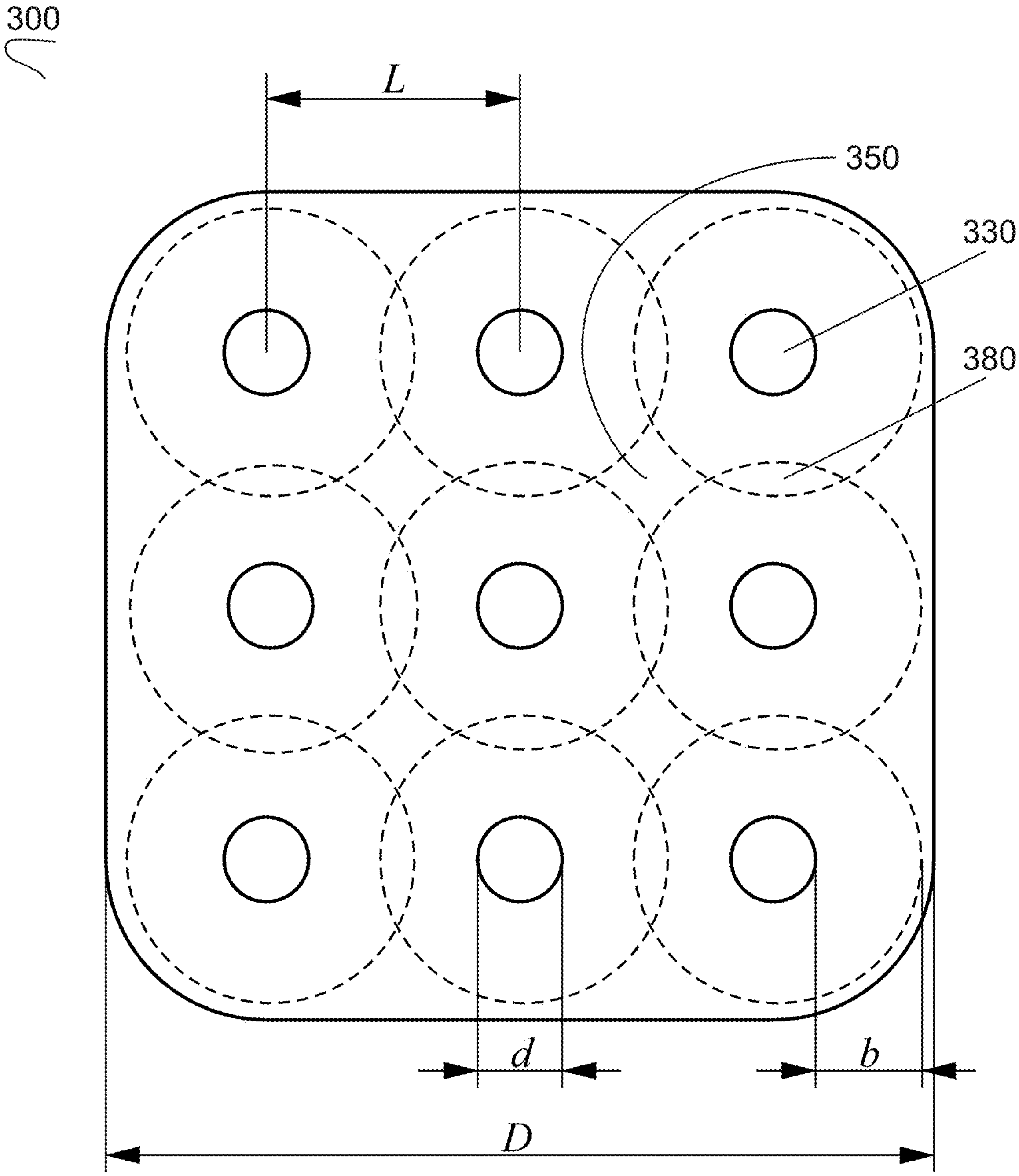
FIG. 3. Schematic cross-section in the lateral plane of a miniarray of VCSELs, according to an embodiment of the present invention, whereas the oxidation starting from the openings forms oxide regions, and the oxide regions originating from the neighboring openings overlap, and non-oxidized areas faun apertures of different VCSELs constituting the miniarray.

FIG. 3 shows schematically a miniarray (300) of an embodiment of the present invention. Particularly, FIG. 3 shows a cross-section in the plane parallel to the lateral plane, the plane of the cross section being the plane of the layer subject to oxidation. The mesa has the shape of a square D×D with rounded corners. The mesa contains a 3×3 array of openings (330), the centers of the neighboring openings are placed at a distance L from each other. Each of the openings has a circular shape with a diameter d. The process of the selective oxidation results in the oxidation of the areas of the layer subject to oxidation over a depth of b. A skilled in the art will appreciate that once the oxidation of the layer or layers of AlAs or Ga(1−x)Al(x)As is performed in the atmosphere of the water vapor, the oxidation depth can be controlled by the temperature in the reactor, by the vapor pressure, by the aluminum composition in the layers, by the layer thickness and by the duration of the process. The oxidation depth is preferably selected such that $$d+2b>L. \qquad (1)$$

Then the oxidized areas, originating from neighboring openings, overlap (380). Thus, four separated non-oxidized areas (apertures) (350) are formed.

Figure 4A:
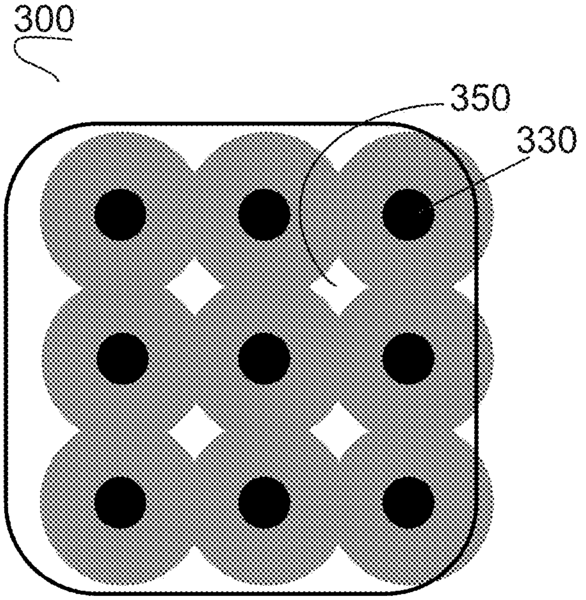
FIG. 4A. An alternative representation of the embodiment of FIG. 3 showing the openings, the oxidized areas and the non-oxidized apertures of the VCSEL miniarray.

FIG. 4A illustrates schematically the same cross-section of the structure (300) in the plane parallel to the lateral plane. The openings filled by a dielectric are marked black (330), the oxidized areas are gray, and the non-oxidized areas (apertures) are white (350). In the embodiment of FIGS. 3 and 4A the apertures are diamond-shaped.

Figure 4B:
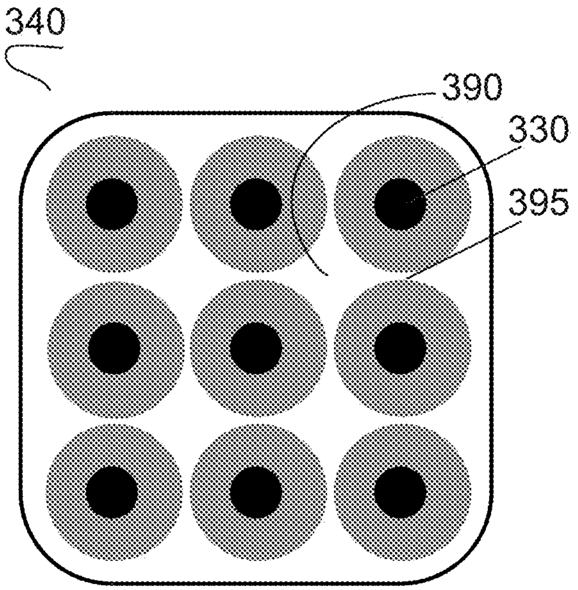
FIG. 4B. A schematic representation of another embodiment of the present invention, whereas the oxidized areas originating from the neighboring openings do not overlap.

FIG. 4B illustrates schematically the same cross-section (340) of the structure in the plane parallel to the lateral plane, according to another embodiment of the present invention. The oxidized areas originating from the neighboring holes, do not overlap. Thus, the neighboring apertures (390) are connected to each other. In spite of such connections, each of the apertures is capable to confine an optical mode in the lateral plane. The lateral dimensions of the bottlenecks (395) connecting the neighboring apertures govern the coupling strength between the neighboring apertures.

Figure 5:
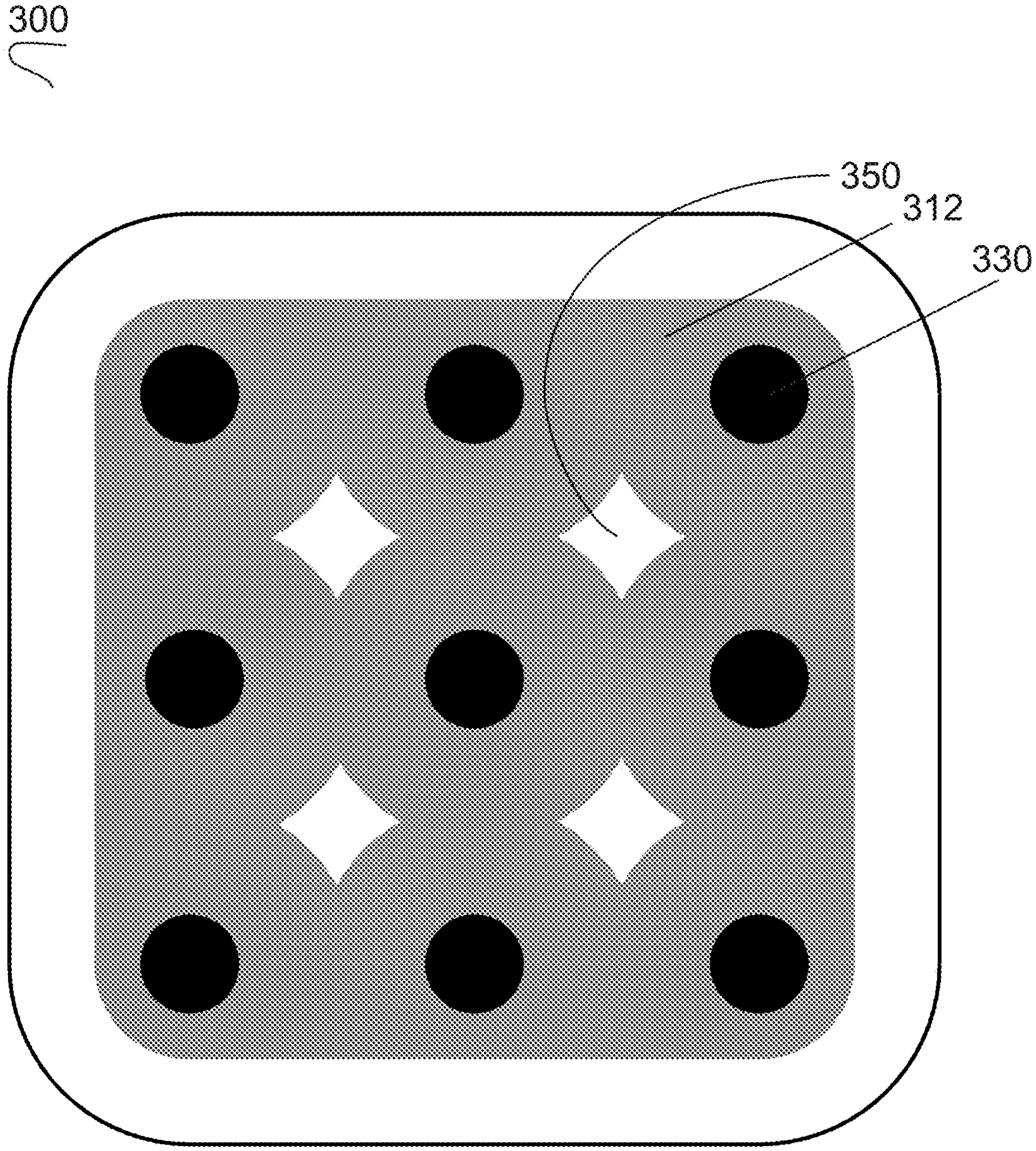
FIG. 5. A schematic plan view of the VCSEL miniarray of the embodiment of FIG. 3 showing a top contact.
Figure 6A:
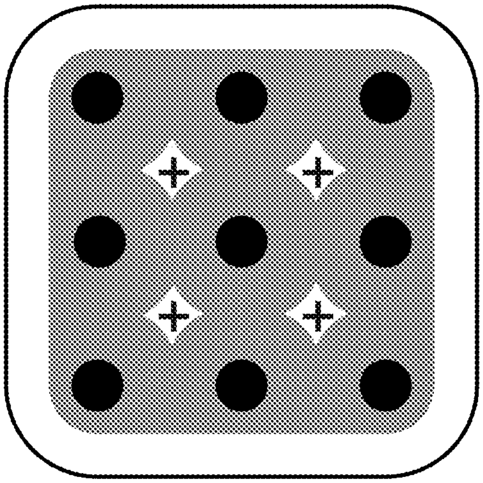
FIG. 6A. A schematic representation of a first lateral optical supermode of a miniarray of four VCSELs of the embodiment of FIG. 3.
Figure 6B:
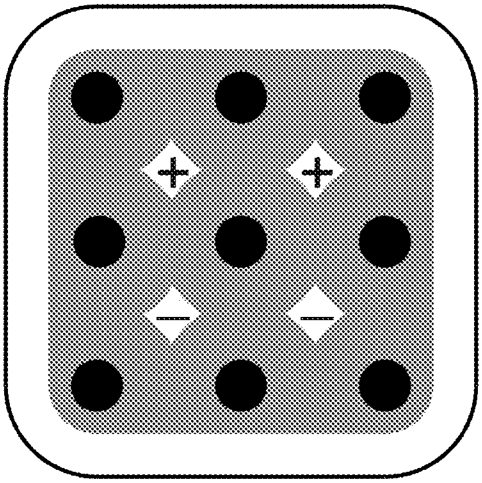
FIG. 6B. A schematic representation of a second lateral optical supermode of a miniarray of four VCSELs of the embodiment of FIG. 3.
Figure 6C:
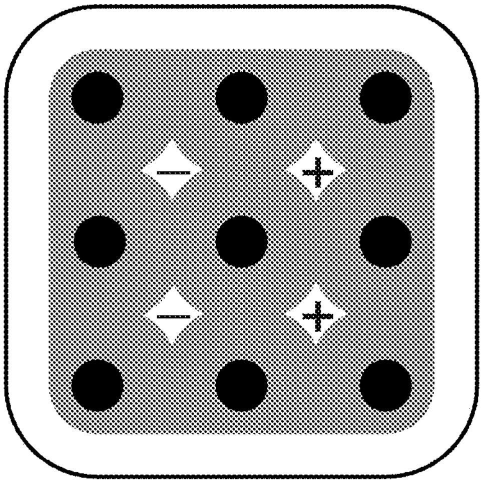
FIG. 6C. A schematic representation of a third lateral optical supermode of a miniarray of four VCSELs of the embodiment of FIG. 3.
Figure 6D:
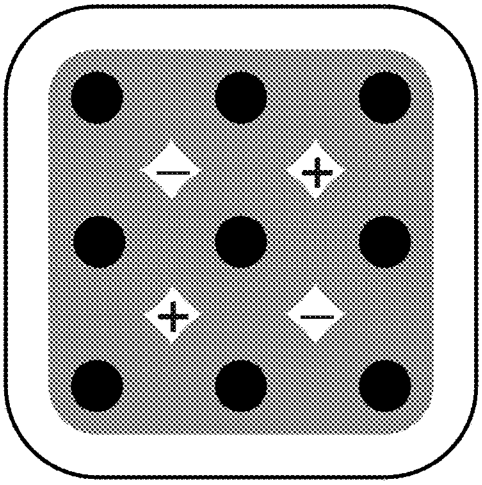
FIG. 6D. A schematic representation of a fourth lateral optical supermode of a miniarray of four VCSELs of the embodiment of FIG. 3.

FIG. 5 illustrates schematically a top plane view of the structure of the embodiment of FIGS. 3 and 4A, showing the top contact (312).

The miniarray (300) can be configured such that the apertures are sufficiently small, and each of the apertures separately is capable to emit laser light only in a single lateral mode. The combination of the electromagnetic fields emitted by different apertures can form lateral supermodes. FIGS. 6A through 6D illustrate schematically the phase relations in four different supermodes. A one skilled in the art will agree that an ideally symmetric 2×2 array of four apertures will form four supermodes as shown in FIGS. 6A through 6D.

Figure 7:
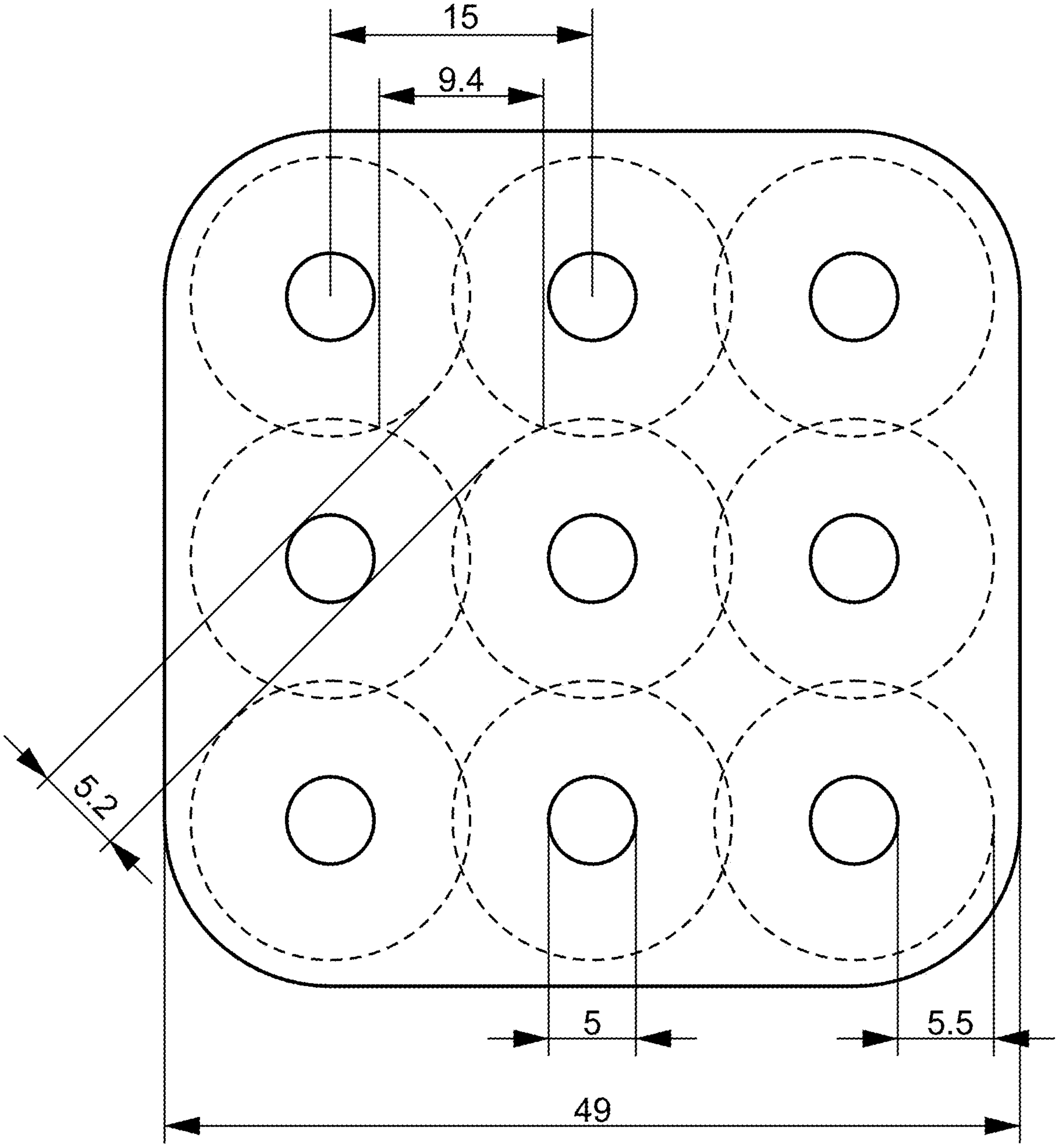
FIG. 7. Example dimensions (in micrometers) of the structure of the embodiment of FIG. 3.

FIG. 7 illustrates example dimensions (in micrometers) of the miniarray of VCSELs of FIGS. 3 through 5. The mesa has the shape of a square 49 μm×49 μm with rounded corners. The separation between the centers of the neighboring openings is 15 μm, the diameter of each opening is 5 μm, and the oxidation depth is 5.5 μm. Then the minimum dimension of the diamond-shaped apertures is 5.2 μm, and its maximum dimension is 9.4 μm.

Figure 8:
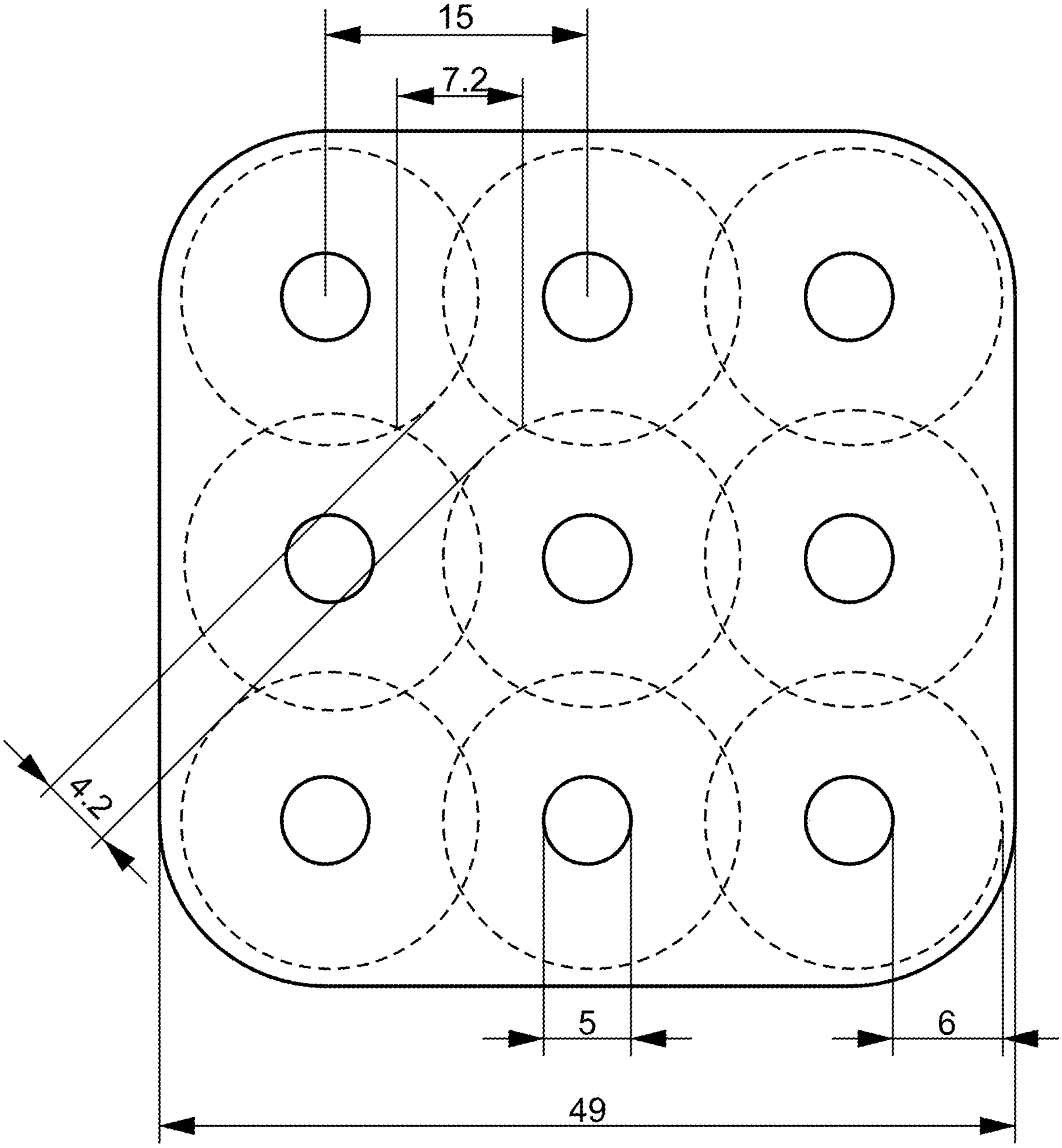
FIG. 8. Example dimensions (in micrometers) of the structure of another embodiment of the present invention.

FIG. 8 illustrates a different example dimension of the VCSEL miniarray according to another embodiment of the present invention. The oxidation depth is larger, 6 μm. Correspondingly, the size of the non-oxidized areas (apertures) is smaller. The minimum dimension of the diamond-shaped apertures is 4.2 μm, and its maximum dimension is 7.2 μm.

The splitting of the wavelengths of the four supermodes illustrated in FIGS. 6A through 6D is controlled by the spacing between the apertures. By proper selection of the geometrical dimensions of the VCSEL aperture surface and aperture thickness in the miniarray, each aperture will confine only one optical mode and the root mean square (nus) of the lasing spectrum of the miniarray can be made smaller than 1 nm.

Further, the lasing spectrum rms can be made below 0.6 nm and even below 0.1 nm.

A one skilled in the art will agree that the number of the lateral modes of the miniarray, once each aperture is sufficiently small is equal to the number of the apertures. Polarization degeneracy can result in a larger number of coupled modes. In case the splitting between the lasing wavelengths in different supermodes is too small, the structure imperfections may lead to the fact that different coupled modes in the miniarray can lase, and the modes can switch. The modeling of typical dependence of the VCSEL mode wavelength on the aperture diameter done for VCSELS with a circular aperture (e.g. V. Kalosha et al., "LEAKAGE-ASSITED TRANSVERSE-MODE SELECTION IN VERTICAL-CAVITY LASER WITH THICK LARGE-DIAMETER OXIDE APERTURES", IEEE Journal of Quantum Electronics, volume 49, issue 12, pages 1034-1039 (2013), whereas this publication is hereby incorporated herein in its entirety by reference and hereafter denoted as Kalosha'13) can be used for estimates also for an arbitrary shape of an aperture. Thus, once the aperture size is close to 4 μm, its fluctuations of a value of ~0.5 pint shifts the wavelength less than by 0.2 nm. All this enables a rather narrow emission spectrum from a miniarray of VCSELs.

A one skilled in the art will agree that the lateral size of the openings for the disclosed miniarray of VCSELs should be rather small. Preferably the lateral size of the openings should be below 10 micrometers.

And more preferably, the lateral size of the openings should be below 6 micrometers.

If the openings have a non-symmetric shape, the preferred size is related to the maximum lateral size of the openings.

Figure 9A:
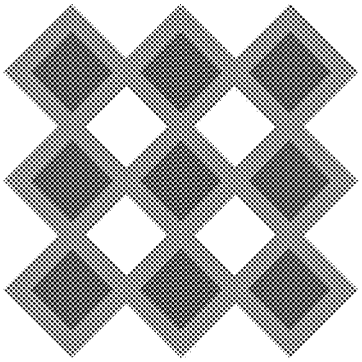
FIG. 9A. A schematic cross-section in the lateral plane passing through a layer subject to oxidation, according to yet another embodiment of the present invention.

FIG. 9A through 9D illustrate different embodiments of the present invention. FIG. 9A refers to an embodiment with square-shaped openings and square shaped apertures.

Figure 9B:
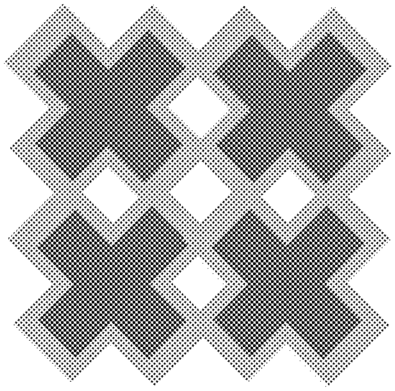
FIG. 9B. A schematic cross-section in the lateral plane passing through a layer subject to oxidation, according to a further embodiment of the present invention.

FIG. 9B illustrates a miniarray with five apertures.

Figure 9C:
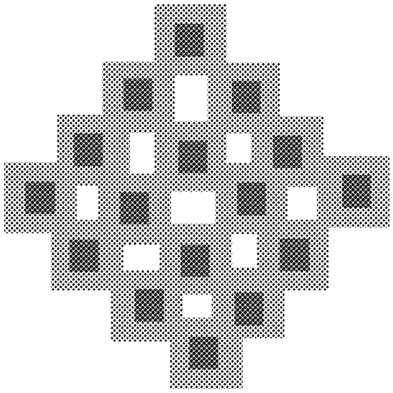
FIG. 9C. A schematic cross-section in the lateral plane passing through a layer subject to oxidation, according to another embodiment of the present invention.
Figure 9D:
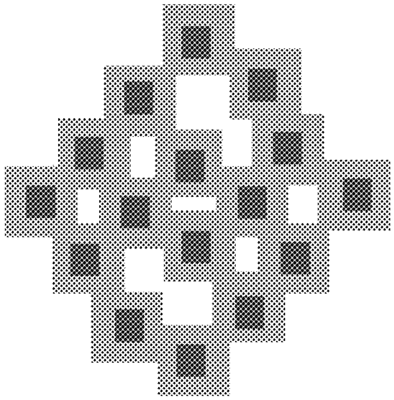
FIG. 9D. A schematic cross-section in the lateral plane passing through a layer subject to oxidation, according to yet another embodiment of the present invention.

FIGS. 9C and 9D illustrate further embodiments with low-symmetry apertures shapes. For example, elongated aperture shapes are advantageous to obtain a linearly polarized lasing.

A miniarray of VCSELs can be configured such that several aperture regions (at least two) provide coherent lasing.

Further, unequal shapes of the apertures can be applied to configure a single lateral mode miniarray of VCSELs.

Different modifications in the design may be applied. Thus, the concept of the passive cavity laser can be employed in the miniarrays. The concept of the passive cavity laser was disclosed in the U.S. Pat. No. 8,472,496, entitled "OPTOELECTRONIC DEVICE AND METHOD OF MAKING SAME", filed Jun. 6, 2010, issued Jun. 25, 2013, and in the U.S. Pat. No. 8,576,472, entitled "OPTOELECTRONIC DEVICE WITH CONTROLLED TEMPERATURE DEPENDENCE OF THE EMISSION WAVELENGTH AND METHOD OF MAKING SAME", filed Oct. 28, 2010, issued Nov. 5, 2013, both invented by one inventor of the present invention, Ledentsov, whereas both inventions are hereby incorporated herein in their entirety by reference.

Figure 10:
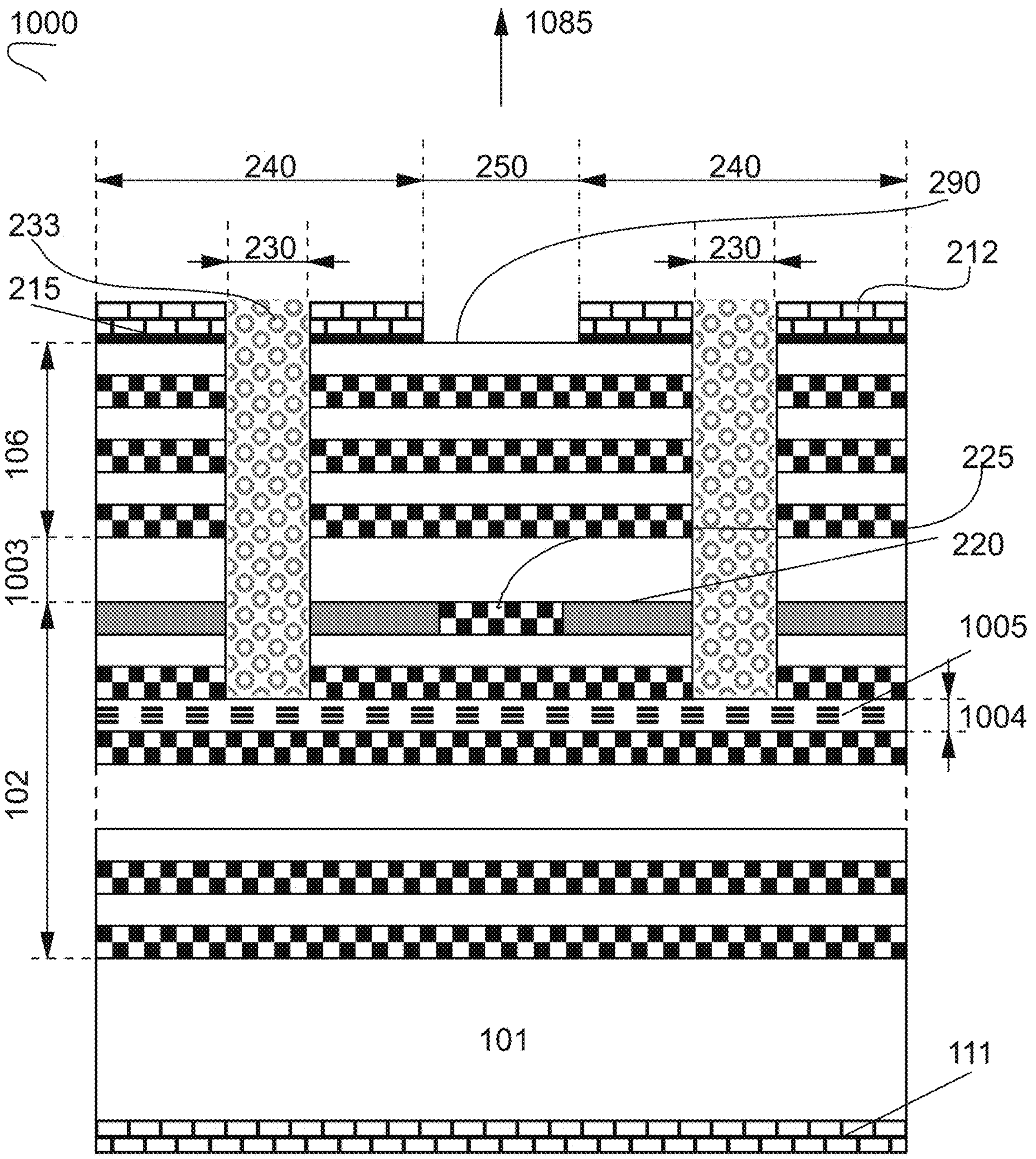
FIG. 10. Schematic cross-section in the vertical plane of a miniarray of passive cavity surface-emitting lasers, in which the selective oxidation starts from the openings in the structure and results in the formation of oxide-confined apertures.

FIG. 10 shows schematically a cross-section in the vertical plane of a miniarray (1000) of passive cavity surface-emitting lasers according to yet another embodiment of the present invention. The p-n junction (1004) further containing the active region (1005) is not located in the resonant cavity (1003), but is shifter to the bottom DBR (102). The active region (1004) generates laser light which comes out (1085) through the top DBR (106). A shift of the active region (1005) away from the resonant cavity (1003) to the DBR (102) preferably does not exceed 1 μm.

A different type of individual devices composing a miniarray can be applied. In a further embodiment of the present invention, a miniarray is composed of surface-emitting tilted cavity lasers. Tilted cavity laser (TCL) was disclosed in the U.S. Pat. No. 7,031,360, entitled "TILTED CAVITY SEMICONDUCTOR LASER (TCSL) AND METHOD OF MAKING SAME", filed Feb. 12, 2002, issued Apr. 18, 2006, and in the U.S. patent application Ser. No. 11/194,181, entitled "TILTED CAVITY SEMICONDUCTOR DEVICE AND METHOD OF MAKING SAME", filed Aug. 1, 2005, published online Dec. 15, 2005, publication US2005/0276296, both invented by the inventors of the present invention, whereas both are hereby incorporated herein in their entirety by reference.

In another embodiment of the present invention, a miniarray is composed of surface-emitting tilted wave lasers. Tilter wave laser (TWL) was disclosed in the U.S. Pat. No. 7,421,001, entitled "EXTERNAL CAVITY OPTOELECTRONIC DEVICE", filed Jun. 16, 2006, issued Sep. 2, 2008, and in the U.S. Pat. No. 7,583,712, entitled "OPTOELECTRONIC DEVICE AND METHOD OF MAKING SAME", filed Jan. 3, 2007, issued Sep. 1, 2009, both invented by the inventors of the present invention, whereas both are hereby incorporated herein in their entirety by reference.

Figure 11A:
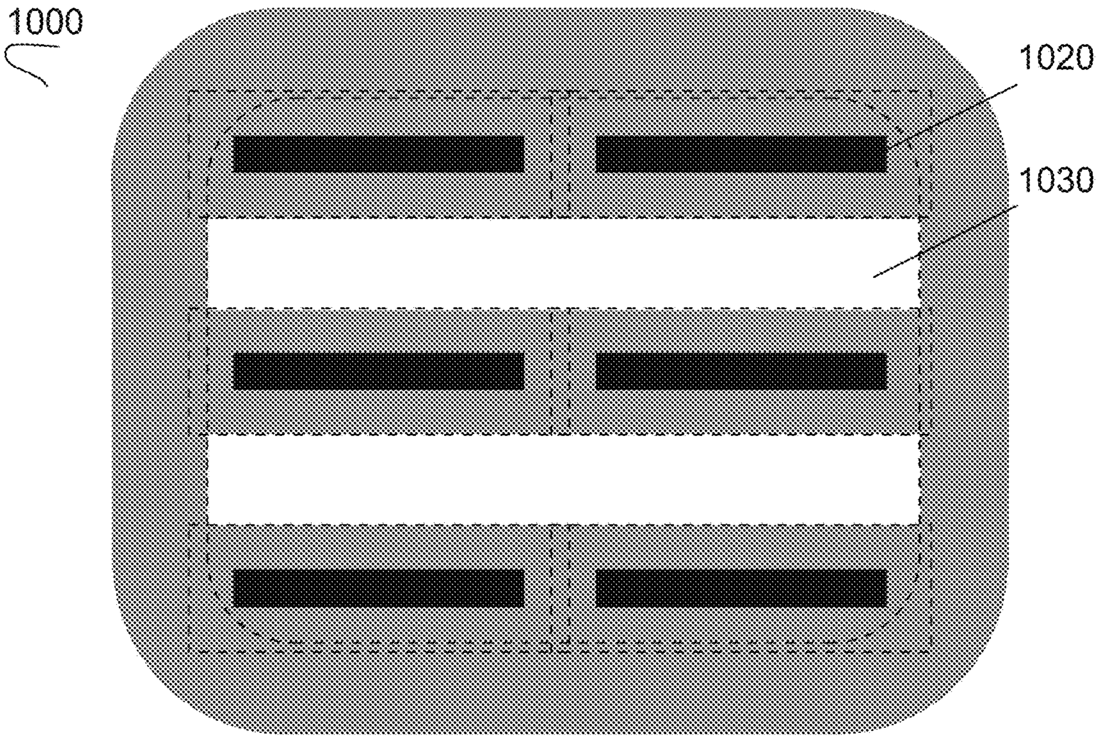
FIG. 11A. A schematic cross-section in the lateral plane passing through a layer subject to oxidation, according to a further embodiment of the present invention.

FIG. 11A illustrates schematically a cross-section in a lateral plane of a miniarray (1000) of VCSELs, according to a further embodiment of the present invention. The holes (1020) are elongated, and, thus, the non-oxidized areas form apertures (1030) having a shape of elongated stripes.

Figure 11B:
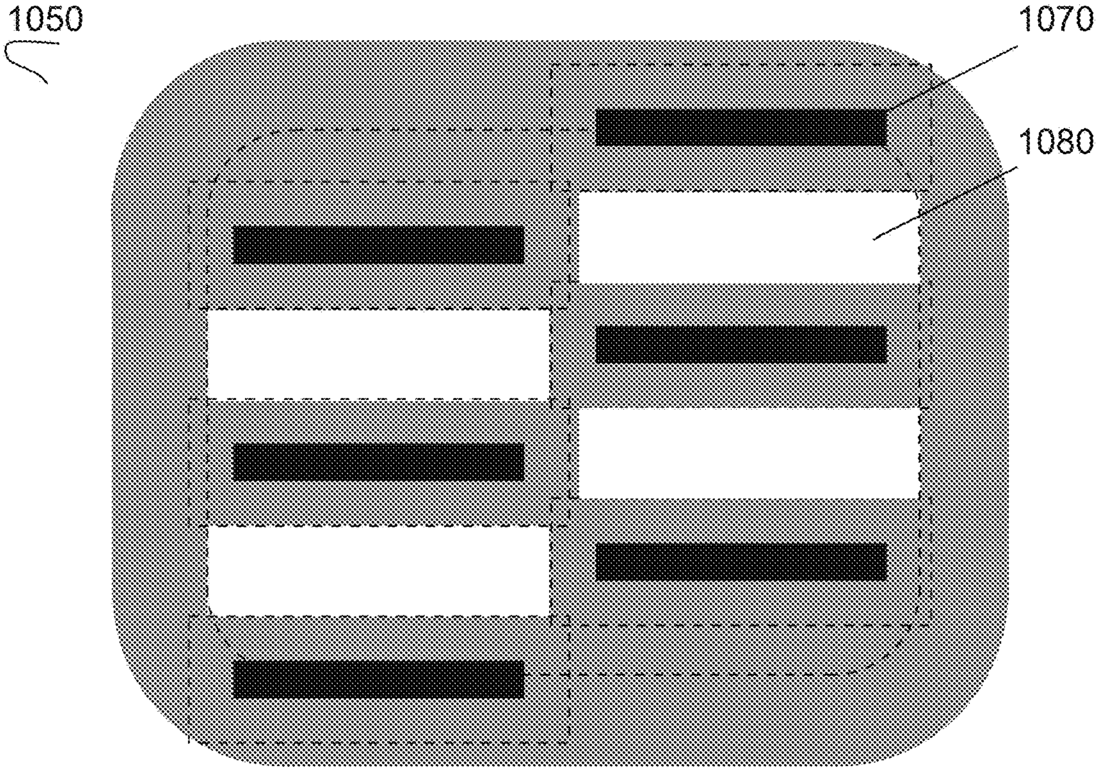
FIG. 11B. A schematic cross-section in the lateral plane passing through a layer subject to oxidation, according to another embodiment of the present invention.

FIG. 11B illustrates schematically a cross-section in a lateral plane of a miniarray (1050) of VCSELs, according to another embodiment of the present invention. The elongated holes (1070) are shifted with respect to each resulting in elongated apertures (1080) shifted with respect to each other. An optical mode formed in each of the apertures, can be coupled with an optical mode formed in a neighboring aperture, the coupling occurring via the corners of the apertures.

Figure 12:
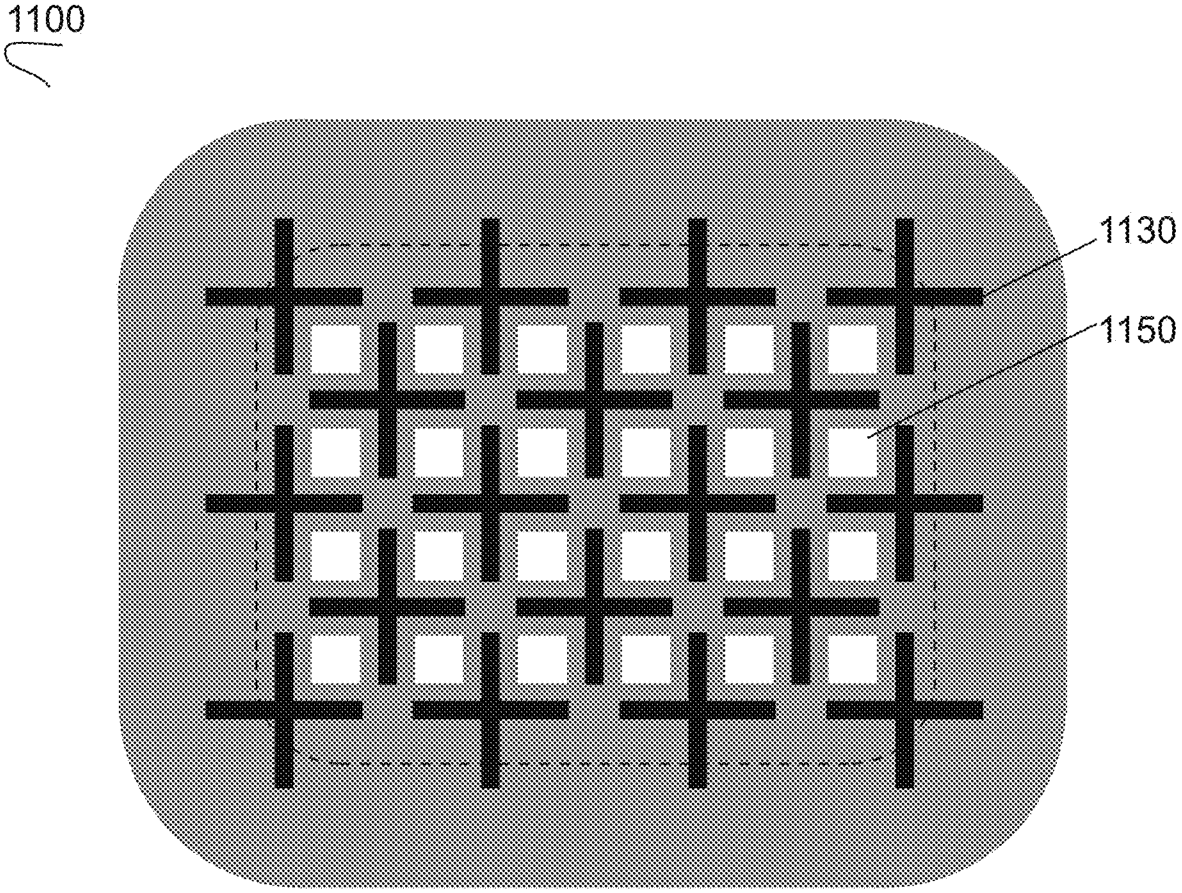
FIG. 12. A schematic cross-section in the lateral plane passing through a layer subject to oxidation, according to yet another embodiment of the present invention.

FIG. 12 illustrates schematically cross-section in a lateral plane of a miniarray (1100) of VCSELs, according to yet another embodiment of the present invention. Holes (1130) have the shape of crosses, whereas the apertures (1150) are square-shaped.

FIG. 18 illustrates an approach to extend the −3 dB modulation bandwidth of a miniarray of VCSELs. The approach has been disclosed by U. Feiste in an non-patent journal publication "OPTIMIZATION OF MODULATION BANDWIDTH IN DBR LASERS WITH DETUNED BRAGG REFLECTORS", IEEE Journal of Quantum Electronics, Volume 34, issue 12, pages 2371-2379, December 1998, whereas this publication is hereby incorporated herein in its entirety by reference. Due to an interplay of a dominant optical mode of an optoelectronic device having a higher finesse with a side mode having a lower finesse, the modulation width can be drastically enhanced. An example is illustrated in FIG. 18, whereas the electrooptical response of a device based on two coupled cavities (B) has a significantly higher −3 dB cutoff frequency than a device based on a single cavity (A). An example shows a possibility of an enhancement of the −3 dB cutoff frequency by a factor larger than 2.

Figure 13A:
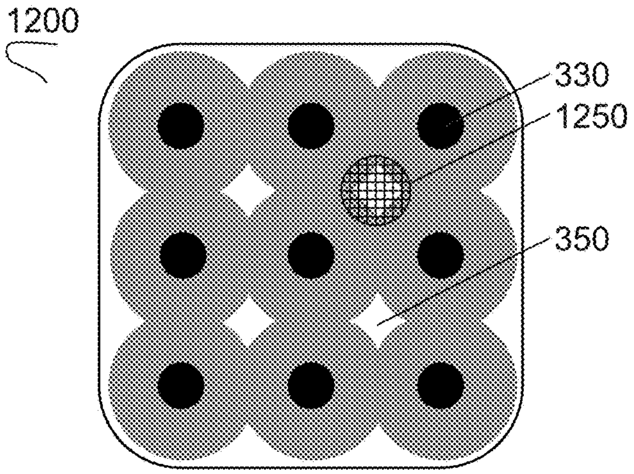
FIG. 13A. A schematic representation of a miniarray of VCSELs, in which one aperture is covered by a highly reflecting coating.
Figure 13B:
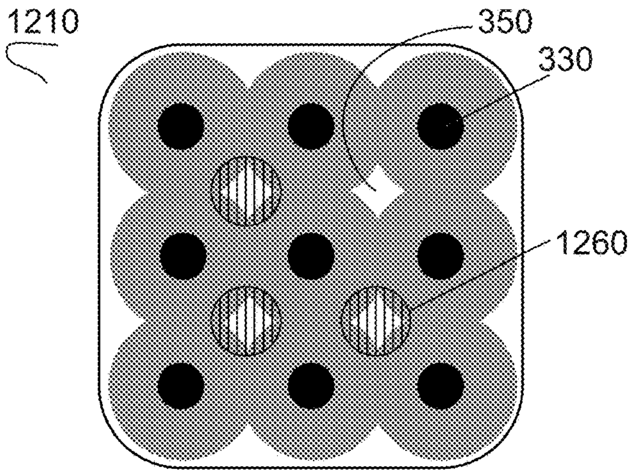
FIG. 13B. A schematic representation of a miniarray of VCSELs, in which three apertures out of four are covered by an anti-reflective coating.
Figure 13C:
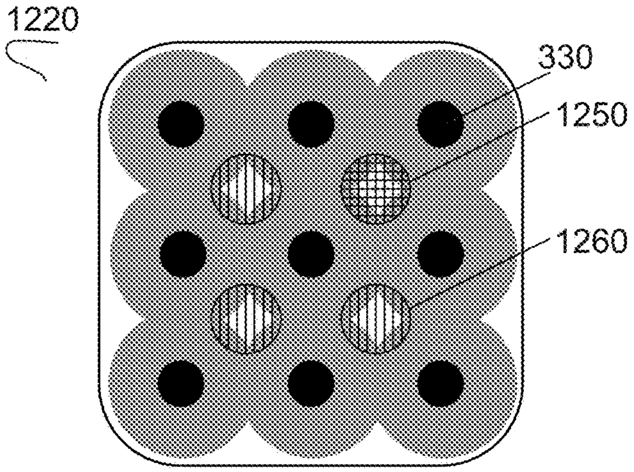
FIG. 13C. A schematic representation of a miniarray of VCSELs, in which one aperture out of four is covered by a highly reflecting coating, and three apertures out of four are covered by an anti-reflective coating.

FIG. 13A through 13C illustrates schematically a practical realization of this approach in miniarray of VCSELs according to various embodiments of the present invention. FIG. 13A illustrates a miniarray (1200) of VCSELs according to an embodiment of the present invention, in which one of the apertures is covered by a highly reflecting dielectric coating (1250) forming one mode having a higher finesse versus a lower finesse of the rest three modes.

FIG. 13B illustrates a miniarray (1210) of VCSELs according to another embodiment of the present invention, in which three apertures are covered by anti-reflective coatings (1260) forming three modes having a lower finesse versus a higher finesses of a single mode related to an uncovered aperture.

FIG. 13C illustrates a miniarray (1220) of VCSELs according to yet another embodiment of the present invention, in which one aperture is covered by a highly reflecting coating (1250), whereas the other three apertures are covered by anti-reflective coatings (1260), thus combining the features of the embodiments of FIGS. 13A and 13B.

Such an approach employing the formation of coupled cavity optical mode and controlling separately the finesses of individual cavities allows an increase of the modulation bandwidth of the VCSEL miniarray up to at least 70 GHz.

For each of the embodiments of FIGS. 13A through 13C the approach of FIG. 18 is realized, resulting in a significant enhancement of the modulation bandwidth.

Figure 14A:
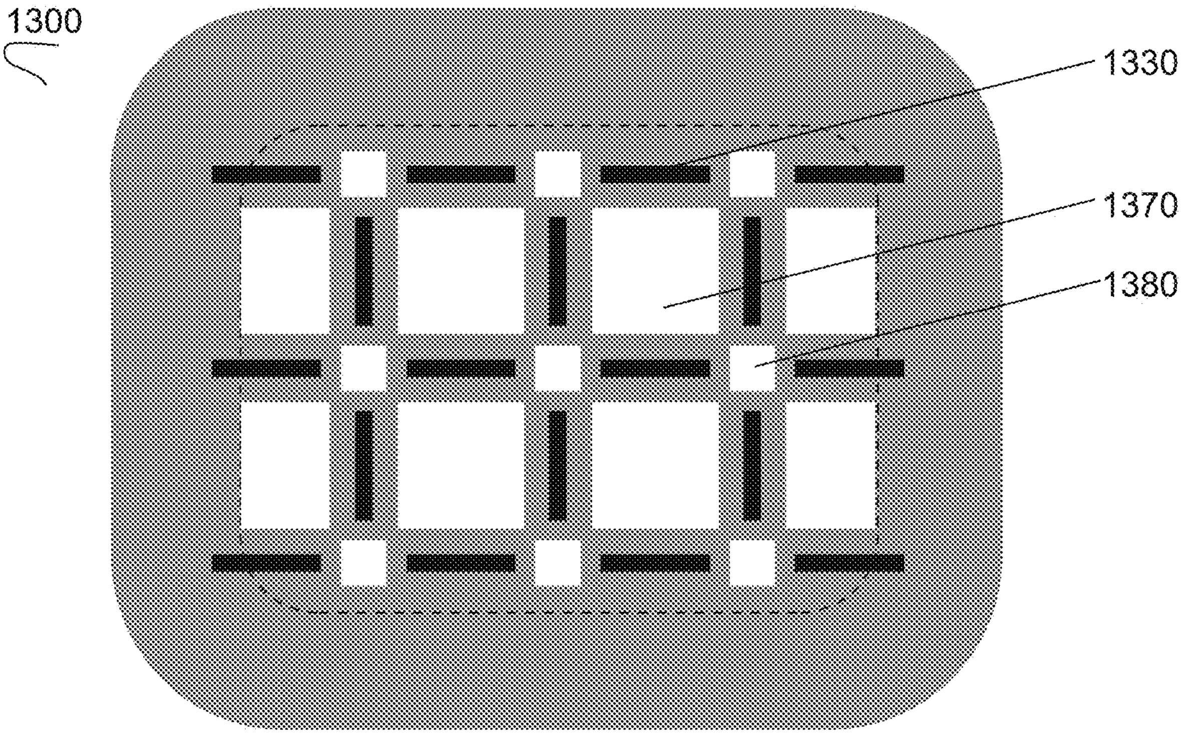
FIG. 14A. A schematic cross-section in the lateral plane passing through a layer subject to oxidation, according to an embodiment of the present invention, containing two types of apertures, with a smaller and a larger area.

FIG. 14A illustrates schematically a miniarray (1300) of VCSELs according to an embodiment of the present invention, whereas the holes (1330) have elongated shape, and apertures form a checkerboard array of alternating apertures having a larger area (1370) and apertures having a smaller area (1380).

Figure 14B:
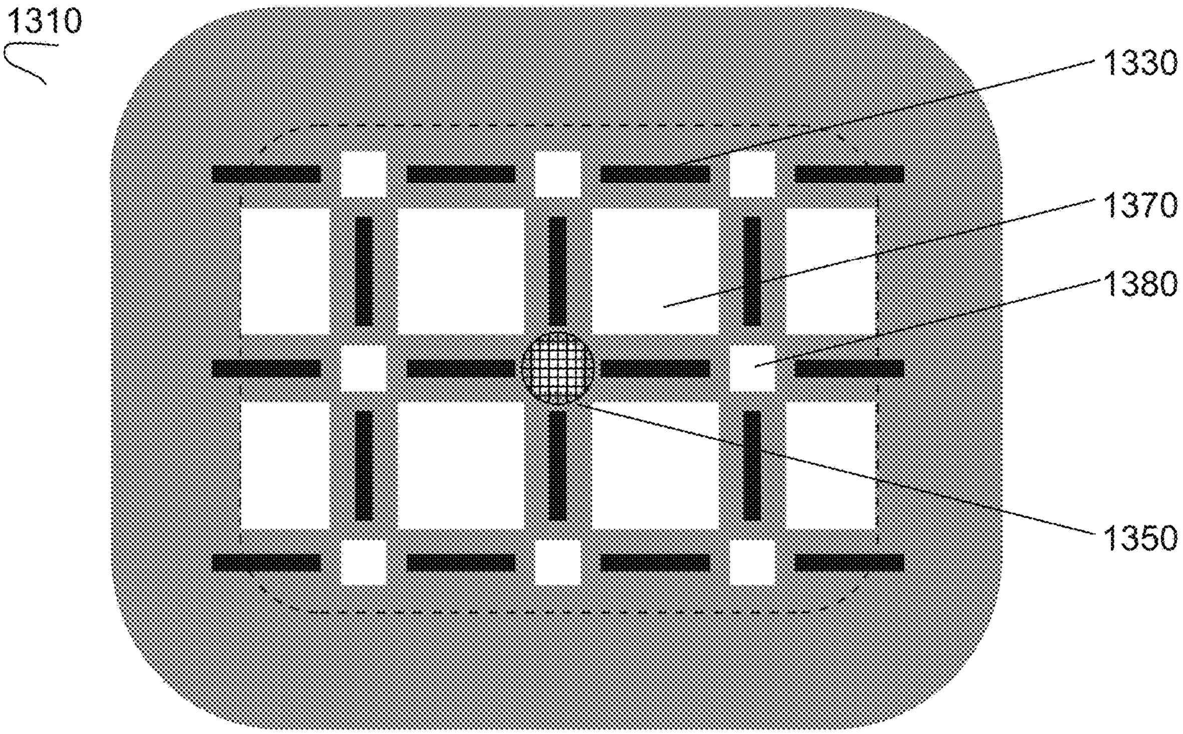
FIG. 14B. A schematic cross-section in the lateral plane passing through a layer subject to oxidation, according to an embodiment of FIG. 13A, whereas an area with a smaller aperture is covered on top by a highly reflecting coating.

FIG. 14B illustrates schematically a miniarray (1310) of VCSELs according to another embodiment of the present invention, whereas a highly reflective coating (1350) is deposited over one of the apertures having a smaller area (1380). This allows to employ an approach of FIG. 18 and thus to enhance significantly a −3 dB modulation bandwidth of the device.

Figure 15:
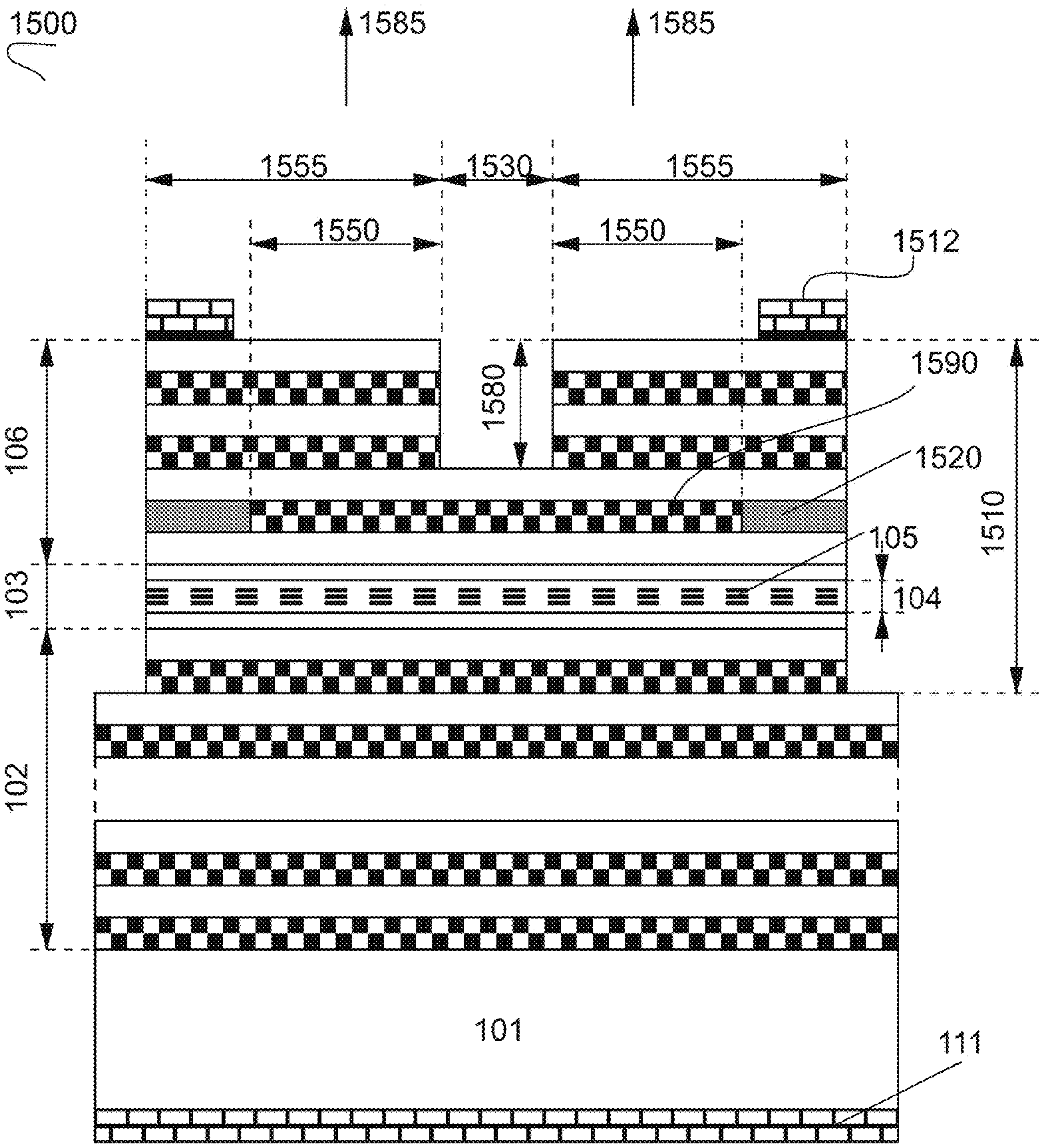
FIG. 15 shows schematically a cross-section by a vertical plane of a miniarray of VCSELs, in which the holes are only moderately etched, and the plane of the layers subject to selective oxidation are not etched through. Thus, the selective oxidation occurs only from the edges of the mesa.

FIG. 15 illustrates schematically a miniarray (1500) of VCSELs (1555), according to yet another embodiment of the present invention. The etching depth (1580) of the hole (1530) is smaller than the thickness of the top DBR (106). Thus the layer (1590) subject to selective oxidation is not etched through in the hole (1530). Thus, no oxidation occurs in the hole (1530). The only oxidation occurs from the side walls of the mesa (1510) forming a layer of oxide (1520). Non-oxidized areas form VCSELs (1550) emitting the laser light (1585).

Figure 16A:
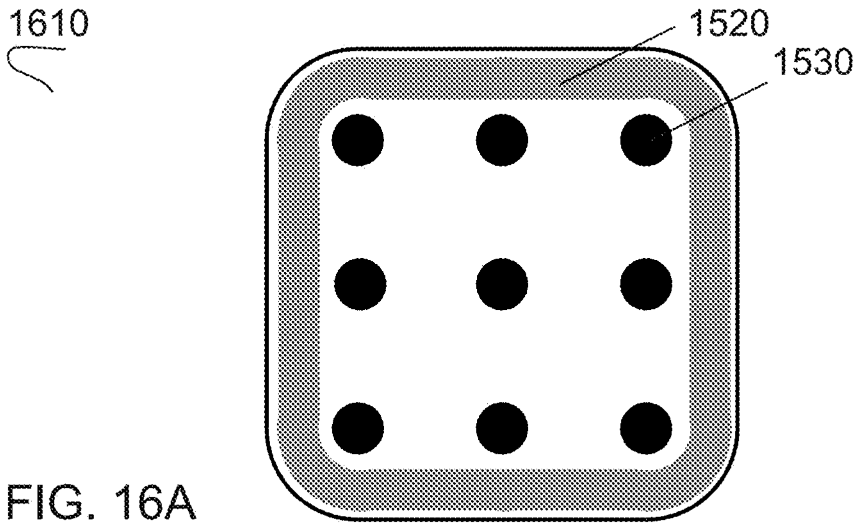
FIG. 16A shows schematically a cross-section in the lateral plane of a microrarray of VCSELs of the embodiment of FIG. 15, in which the oxidation occurs only from the edges of the mesa.

FIG. 16A illustrates schematically a miniarray (1610) formed according to the embodiment of FIG. 15. A cross-section in the lateral plane is shown. The layer of the oxide (1520) is formed only at the sides of the mesa.

Figure 16B:
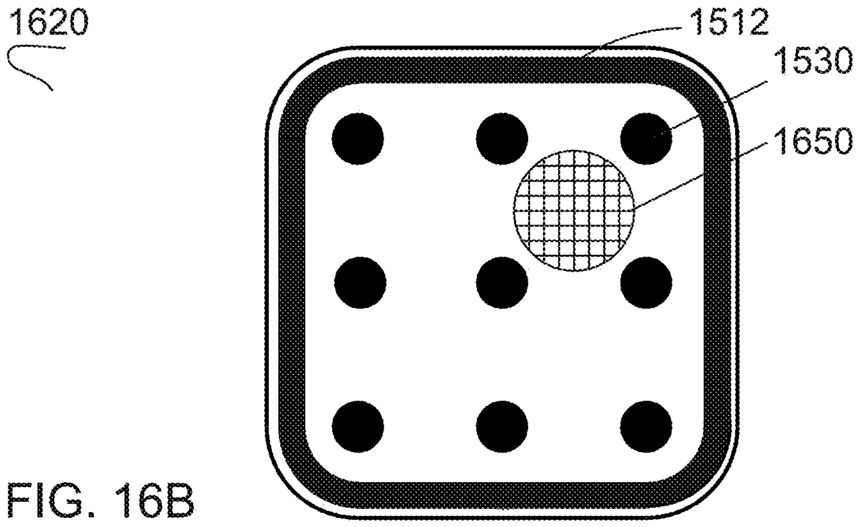
FIG. 16B shows schematically a top view of a miniarray of VCSELs of the embodiment of FIG. 15, in which a highly reflecting coating is deposited on top of one aperture, and a common top contact for the entire miniarray is mounted above the area oxidized from the side of the mesa.

FIG. 16B illustrates schematically a top view (1620) of the VCSEL miniarray of FIG. 16A. The top contact (1512) is mounted above the oxide layer (1520) formed in the specific layer or layers subject to oxidation, but only at the side boundaries of the mesa. A highly reflecting coating (1650) is mounted above one aperture.

It is further advantageous to apply to a miniarray of VCSELs the concept of an antiwaveguiding cavity, disclosed in the U.S. Pat. No. 7,339,965 "OPTOELECTRONIC DEVICE BASED ON AN ANTIWAVEGUIDING CAVITY", filed Apr. 5, 2005, issued Mar. 4, 2008, invented by the inventors of the present invention, whereas the patent is hereby incorporated herein in its entirety by reference. FIGS. 17A through 17J illustrate a drastic difference between a VCSEL based on a waveguiding cavity and that based on an antiwaveguiding cavity. FIGS. 17A through 17E refer to a VCSEL based on a waveguiding cavity, with the following relation between the refractive index of the resonant cavity and the average refractive index of the DBRs, $$n_{cavity} > n_{DBR}. \tag{2}$$

FIG. 17A illustrates a refractive index profile as well as the profiles of the vertical optical mode and a waveguided mode for a waveguiding VCSEL having 1λ-cavity. The profiles are shown for the central part of the structure.

FIG. 17B illustrates a refractive index profile as well as the profiles of the vertical optical mode for a waveguiding VCSEL. The profiles are shown for the non-oxidized area of the VCSEL (for the aperture area).

FIG. 17C illustrates a refractive index profile as well as the profiles of the waveguided optical mode for the considered VCSEL having 1λ-cavity. The profiles are shown for the non-oxidized area (for the aperture area).

FIG. 17D illustrates a refractive index profile as well as the profiles of the vertical optical mode for the considered VCSEL having 1λ-cavity. The profiles are shown for the oxidized area.

FIG. 17E illustrates a refractive index profile as well as the profiles of the waveguided optical mode for the considered waveguiding VCSEL having 1λ-cavity. The profiles are shown for the oxidized area. Only a slight difference from the mode profile of FIG. 17C is encountered.

The main feature of the waveguiding VCSELs onto which the focus is made in FIGS. 17A through 17E is the existence, along with the vertical optical mode, in which the lasing of the VCSEL occurs, also a waveguided mode, having a comparable intensity in the active region, as the intensity of the VCSEL mode. The existence of the waveguided mode implies:

a parasitic light emission in-plane, impeding a possibility of high-speed operation, photoexcitation of non-equilibrium cavities under the layer of the oxide and at the side walls of the mesa, and additional source of the device degradation.

All this led to the fact that historically, no reliable VCSELs operating at a rate >10 GBit/s were possible till the middle of the years 2000-2010.

On the contrary, FIGS. 17F through 17J refer to a VCSEL based on an antiwaveguiding cavity, in which $$n_{cavity} < n_{DBR}. \tag{3}$$

FIG. 17F illustrates a refractive index profile as well as the profiles of the vertical optical mode and a waveguided mode for an antiwaveguiding VCSEL having λ/2-cavity. The profiles are shown for the central part of the structure.

FIG. 17G illustrates a refractive index profile as well as the profiles of the vertical optical mode for the antiwaveguiding VCSEL. The entire vertical profiles are shown for the non-oxidized area of the VCSEL (for the aperture area).

FIG. 17H illustrates a refractive index profile as well as the profiles of the waveguided optical mode for the antiwaveguiding VCSEL. The profiles are shown for the non-oxidized area (for the aperture area).

FIG. 17I illustrates a refractive index profile as well as the profiles of the vertical optical mode for the antiwaveguiding VCSEL. The profiles are shown for the oxidized area.

FIG. 17J illustrates a refractive index profile as well as the profiles of the waveguided optical mode for an antiwaveguiding VCSEL having λ/2-cavity. The profiles are shown for the oxidized area. A drastic suppression of the waveguided mode in the active region versus the profile of FIG. 17H is encountered.

One main advantage of an antiwaveguiding VCSEL versus a waveguiding VCSELs is the thinnest possible cavity having the minimum thickness of λ/2 leading to the maximum possible optical confinement factor of the vertical optical mode thus enabling a high-speed operation.

The next main advantage is related to a strong suppression of the waveguided optical mode.

No parasitic light emission in-plane occurs,

One of the sources of degradation is suppressed,

Reliable VCSELs with the data transmission rate up to and above 50 GBit/s are possible.

Thus, employing the concept of an antiwaveguiding cavity for the VCSEL miniarrays of the present invention enables reaching high speed reliable VCSELs and is therefore extremely advantageous.

It should be noted that the second resonance at a frequency A V in the high frequency response of the VCSEL array of FIG. 18 is related to the splitting between the wavelengths of two optical modes of the system, $$\frac{|\Delta\nu|}{\nu} = \frac{|\Delta\lambda|}{\lambda}. \tag{4a}$$

Hence, $$|\Delta\lambda| = \frac{\lambda^2}{c}|\Delta\nu|, \tag{4b}$$

where c is the velocity of light in the vacuum. Thus, if the second resonance in the high frequency response of FIG. 18 is targeted at 40 GHz and more, and the lasing wavelength is ~850 nm, Eq. (4b) yields a necessary splitting between the modes, $$|\Delta\lambda| > 0.1 \text{ nm}. \tag{5}$$

It is hardly possible to reach such a splitting if all apertures in an array have equal dimensions. To meet such a target, apertures should preferably be different. FIG. 19 shows schematically a cross-section in the lateral plane of a miniarray of VCSELs (1900), according to an embodiment of the present invention. One hole (1930) is shifted from a symmetric position of FIG. 3 by $\Delta L_x$ and $\Delta L_y$ in two lateral directions such that the aperture (1950) is larger than the rest of the apertures (350). Therefore, this aperture localizes the optical mode of the miniarray having the longest wavelength. The splitting of the optical modes can be controlled by varying the position of the hole (1930).

A sample dependence of the wavelength of the resonant VCSEL mode on the apertures size can be found in Kalosha'13. A one skilled in the art will appreciate that a shift of the wavelength of the VCSEL mode strongly depends on the thickness of oxide-confined aperture. In the paper Kalosha'13 two thick oxide confined apertures, each ~70 nm thick are considered. Then, once the aperture diameter is ~6 μm, a change in diameter by ~0.7 μm results in a shift of the mode wavelength by ~0.1 nm. For thinner oxide-confined apertures, even larger difference in the aperture lateral size is required to achieve the same spectral shift.

In order to promote lasing in the preselected lateral optical mode, in this case the fundamental, or the longest wavelength mode, a highly reflecting coating (2050) is deposited above the largest aperture (1930) in a miniarray (2000) of VCSELs, according to another embodiment of the present invention, shown in FIG. 20.

An alternative way to promote a single lateral mode lasing in a miniarray of VCSELs, is illustrated schematically in FIG. 21. In a miniarray (2100) all apertures but the largest one are capped by an anti-reflective coating (2160) thus suppressing all optical modes but the fundamental one.

FIG. 22 shows a miniarray (2200) of the VCSELs, according to a further embodiment of the present invention. Both the largest apertures (1930) is covered by a highly reflecting coating (2050), and all other apertures are covered by an anti-reflective coatings (2160). Such combination promotes a single mode lasing of the miniarray.

FIG. 23 shows schematically a cross-section in the lateral plane of a miniarray of VCSELs (2300). A one-dimensional chain of apertures (2350), whereas the neighboring apertures are separated by an oxide layer (2380) and are connected by narrow non-oxidized paths, forms a miniarray of VCSELs. The top contact (2312) is preferably configured such that each of the VCSELs can be addressed electrically independently.

FIGS. 24A and 24B shows schematically cross-sections of a miniarray (2400) of VCSELs in the vertical and the lateral planes, respectively. Two VCSELs (2441) and (2442) are displayed in FIGS. 24A and 24B. The bottom DBR (102) is a semiconductor DBR, whereas a top DBR is a dielectric DBR (2406). The top contact layer (2421), (2422) and the top metal contact (2412) are selectively etched through to separate top electric contacts of different VCSELs ((2441) and (2442)) constituting the miniarray. The gain medium (2405) is common for all VCSELs.

FIG. 24A shows the cross-section of the miniarray (2400) of VCSELs in the vertical plane denoted as (2410) in FIG. 24B. FIG. 24B shows the cross-section of the miniarray (2400) of VCSELs in the lateral plane passing through the oxide layer. FIG. 24B demonstrates two apertures (2451) and (2452) of two VCSELs, (2441) and (2442), respectively. These two apertures are separated by an area (2460) of etched contact and etched contact layer. The area (2460) provides optical coupling between the apertures (2451) and (2452). Oxide layer (2420) is formed via selective oxidation from the mesa side surfaces (2480).

A one skilled in the art will appreciate that a two-dimensional array of 2×N VCSELs formed of two 1D chains is a device, in which each of the VCSELs can be electrically driven independently.

FIG. 25 shows schematically a cross-section in the lateral plane of a two-dimensional miniarray of VCSELs (2500) according to another embodiment of the present invention. A two-dimensional miniarray (2500) consists of two intersecting one-dimensional chains of apertures as in FIG. 23. The two-dimensional miniarray of VCSELs (2500) can be employed for the beam steering. Thus, addressing individually the VCSELs (2551) and (2552), it is possible to control of the inclination of a beam in one direction, whereas addressing individually the VCSELs (2553) and (2554) enables to control the inclination of the beam in a second direction.

In yet another embodiment of the present invention, other devices in each of the 1D chains of VCSELs or/and more than two devices in 1D chains of VCSELs are addressed to steer the beam in each of the directions.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the feature set out in the appended claims.

What is claimed is:

1. A miniarray of vertical-cavity surface-emitting lasers (VCSELs), wherein said miniarray of VCSELs is formed on a single chip formed from a single epitaxial wafer, wherein said epitaxial wafer comprises a) at least one layer subject to oxidation, and b) a top surface, c) a bottom distributed Bragg reflector (DBR) contiguous to said substrate, d) a resonant cavity contiguous to said bottom DBR on a side opposite to said substrate, e) a top DBR contiguous to said resonant cavity at a side opposite to said bottom DBR, f) an active region, g) a top contact, h) a bottom contact, i) a forward bias applied to said active region through said bottom contact and said top contact, wherein said miniarray of VCSELs further contains a plurality of openings, wherein said openings are formed by etching from said top surface crossing said at least one layer subject to oxidation, wherein oxidation is performed forming in said at least one layer subject to oxidation oxidized regions around said openings and a plurality of non-oxidized regions, which act simultaneously as a plurality of current injection regions and a plurality of apertures for the lateral confinement of vertical cavity modes, wherein each aperture of said plurality of apertures confines at least one lateral optical mode, wherein distinct apertures of said plurality of apertures are optically coupled such that said lateral optical modes of said plurality of apertures interact forming lateral supermodes, wherein the maximum distance between the centers of every two distinct apertures of said plurality of apertures does not exceed 30 micrometers, wherein said miniarray of VCSELs emits laser light, wherein an anti-reflecting element is realized over at least one first aperture of said plurality of apertures, wherein at least one first lateral supermode of said lateral supermodes does lase, wherein at least one second lateral supermode distinct from said first lateral supermode does not lase, wherein the photon-photon interaction between said first lateral supermode and said second lateral supermode result in a modulation bandwidth exceeding 70 GHZ, wherein the coupling efficiency of said laser light to a multimode fiber having a core diameter between 45 micrometers and 55 micrometers exceeds 70%.

2. The miniarray of VCSELs of claim 1, wherein said active region is placed in a position selected from the group of positions consisting of:

i) a position within said resonant cavity;

ii) a position within said bottom DBR;

iii) a position within said top DBR;

iv) a position at the boundary between said resonant cavity and said bottom DBR; and v) a position at the boundary between said resonant cavity and said top DBR.

3. The miniarray of VCSELs of claim 1, wherein said miniarray of VCSELs emits a multimode laser light with a root mean square of the emission spectrum below 1 nm.

4. The miniarray of VCSELs of claim 3,
wherein said miniarray of VCSELs emits a multimode laser light with a root mean square of the emission spectrum below 0.6 nm.

5. The miniarray of VCSELs of claim 4,
wherein said miniarray of VCSELs emits a multimode laser light with a root mean square of the emission spectrum below 0.1 nm.

6. The miniarray of VCSELs of claim 1,
wherein said miniarray of VCSELs emits a single lateral mode laser light.

7. The miniarray of VCSELs of claim 1,
wherein all said openings have a circular shape.

8. The miniarray of VCSELs of claim 1,
wherein at least one opening has a non-circular shape.

9. The miniarray of VCSELs of claim 1,
wherein the emitted laser light is linearly polarized.

10. The miniarray of VCSELs of claim 1,
wherein said active region is placed in said bottom DBR at a distance not exceeding 1 micrometer from the middle plane of said resonant cavity.

11. The miniarray of VCSELs of claim 1,
wherein said active region is placed in said top DBR at a distance not exceeding 1 micrometer from the middle plane of said resonant cavity.

12. The miniarray of VCSELs of claim 1,
wherein lasing in at least two different aperture regions is coherent.

13. The miniarray of VCSELs of claim 10,
wherein VCSELs represent a device selected from a group consisting of:
a) surface-emitting tilted cavity laser, and
b) surface-emitting tilted wave laser.

14. The miniarray of VCSELs of claim 1,
wherein said resonant cavity is an antiwaveguiding cavity.

15. The miniarray of VCSELs of claim 1,
wherein a highly reflective coating is deposited on top of said top surface of said top DBR over at least one second aperture distinct from said at least one first aperture.

16. The miniarray of VCSELs of claim 1,
wherein said anti-reflecting element is realized by a means selected from the group of means consisting of
A) said anti-reflecting element is an anti-reflecting coating, or
B) said anti-reflecting element is realized by selective removal of a part of said top DBR over said at least one first aperture.

17. The miniarray of VCSELs of claim 1,
wherein said miniarray of VCSELs is employed for the beam steering.

18. A miniarray of vertical-cavity surface-emitting lasers (VCSELs),
wherein said miniarray of VCSELs is formed on a single mesa formed of a single epitaxial wafer,
wherein said epitaxial wafer grown on a substrate comprises
a) a bottom distributed Bragg reflector (DBR) contiguous to said substrate,
b) a resonant cavity contiguous to said bottom DBR on a side opposite to said substrate,
c) a top DBR contiguous to said resonant cavity at a side opposite to said bottom DBR,
d) a top surface of said top DBR at a side opposite to said resonant cavity,
e) an active region,
f) at least one layer subject to oxidation,
wherein said miniarray of VCSELs further contains a plurality of openings,
wherein said openings are formed by etching from said top surface not crossing any of said layers subject to oxidation,
wherein oxidation is performed forming in said at least one layer subject to oxidation oxidized regions close to a side surface of said single mesa,
wherein oxidation results in the formation of a plurality of non-oxidized regions, which act simultaneously as a plurality of current injection regions and a plurality of apertures for the lateral confinement of vertical cavity modes,
wherein each aperture of said plurality of apertures confines at least one lateral optical mode,
wherein distinct apertures of said plurality of apertures are optically coupled such that said lateral optical modes of said plurality of apertures interact forming lateral supermodes,
wherein the maximum distance between the centers of every two distinct apertures of said plurality of apertures does not exceed 30 micrometers,
wherein said miniarray of VCSELs further comprises
A) a top contact, and
B) a bottom contact,
C) a forward bias applied to said active region through said bottom contact and said top contact,
wherein said miniarray of VCSELs emits laser light,
wherein an anti-reflecting element is realized over at least one first aperture of said plurality of apertures,
wherein at least one first lateral supermode of said lateral supermodes does lase,
wherein at least one second lateral supermode distinct from said first lateral supermode does not lase,
wherein the photon-photon interaction between said first lateral supermode and said second lateral supermode result in a modulation bandwidth exceeding 70 GHZ,
wherein the coupling efficiency of said laser light to a multimode fiber having a core diameter between 45 micrometers and 55 micrometers exceeds 70%.

* * * * *